United States Patent [19]
Matsumoto

[11] Patent Number: 5,654,707
[45] Date of Patent: Aug. 5, 1997

[54] PARALLEL-TO-SERIAL DATA CONVERSION CIRCUIT

[75] Inventor: Yoshimi Matsumoto, Kanagawa, Japan

[73] Assignee: NEC Corporation, Tokyo, Japan

[21] Appl. No.: 365,073

[22] Filed: Dec. 28, 1994

[30] Foreign Application Priority Data

Dec. 28, 1993 [JP] Japan ................... 5-338487

[51] Int. Cl.[6] ................................................ H03M 9/00
[52] U.S. Cl. ................................................... 341/101
[58] Field of Search .......................... 341/101, 50, 100; 370/110.1

[56] References Cited

U.S. PATENT DOCUMENTS

| | | |
|---|---|---|
| 4,023,144 | 5/1977 | Koenig . |
| 4,328,484 | 5/1982 | Denecke . |
| 4,403,322 | 9/1983 | Kato et al. ............... 370/110.1 |
| 4,409,587 | 10/1983 | Scott . |
| 4,426,685 | 1/1984 | Lorentzen . |

FOREIGN PATENT DOCUMENTS 0 067 384 12/1982 European Pat. Off. .

OTHER PUBLICATIONS

"Digital Electric Circuit"; Shokodo (Inc.), Japan; pp. 132–135. (no date given).
"Transmission Engineering"; Ohm Company, Japan; pp. 132–141. (no date given).
European Search Report, Jan. 29, 1997.

*Primary Examiner*—Brian K. Young
*Attorney, Agent, or Firm*—Whitham, Curtis, Whitham & McGinn

[57] ABSTRACT

A parallel-to-serial data conversion circuit includes a control circuit receiving a load signal, a clock signal and high-order 4 bits of a parallel data of 8-bit PCM code excluding the MSB bit, for generating a first control signal and a second control signal, a 6-bit shift register receiving the first control signal, the second control signal, low-order 4 bits of the parallel data, a store signal and the clock signal, and a selector for selecting the output of the shift register on the basis of the MSB bit and the first control signal.

20 Claims, 25 Drawing Sheets

FIGURE 7 PRIOR ART

| law | | PCM | 2's Comp (14bit) | deci |
|---|---|---|---|---|
| +127 | A | 10000000 | 01111110000000 | 8064 |
| | A | 10000001 | 01111010000000 | |
| | A | 10000010 | 01110110000000 | |
| | A | 10000011 | 01110010000000 | |
| | A | 10000100 | 01101110000000 | |
| | A | 10000101 | 01101010000000 | |
| | A | 10000110 | 01100110000000 | |
| | A | 10000111 | 01100010000000 | |
| | A | 10001000 | 01011110000000 | |
| | A | 10001001 | 01011010000000 | |
| | A | 10001010 | 01010110000000 | |
| | A | 10001011 | 01010010000000 | |
| | A | 10001100 | 01001110000000 | |
| | A | 10001101 | 01001010000000 | |
| | A | 10001110 | 01000110000000 | |
| | A | 10001111 | 01000010000000 | 4224 |
| | A | 10010000 | 00111111000000 | |
| | A | 10010001 | 00111101000000 | |
| | A | 10010010 | 00111011000000 | |
| | A | 10010011 | 00111001000000 | |
| | A | 10010100 | 00110111000000 | |
| | A | 10010101 | 00110101000000 | |
| | A | 10010110 | 00110011000000 | |
| | A | 10010111 | 00110001000000 | |
| | A | 10011000 | 00101111000000 | |
| | A | 10011001 | 00101101000000 | |
| | A | 10011010 | 00101011000000 | |
| | A | 10011011 | 00101001000000 | |
| | A | 10011100 | 00100111000000 | |
| | A | 10011101 | 00100101000000 | |
| | A | 10011110 | 00100011000000 | |
| | A | 10011111 | 00100001000000 | 2112 |

FIGURE 8 PRIOR ART

| | | | |
|---|---|---|---|
| A | 10011111 | 00100001000000 | 2112 |
| A | 10100000 | 00011111100000 | |
| A | 10100001 | 00011110100000 | |
| A | 10100010 | 00011101100000 | |
| A | 10100011 | 00011100100000 | |
| A | 10100100 | 00011011100000 | |
| A | 10100101 | 00011010100000 | |
| A | 10100110 | 00011001100000 | |
| A | 10100111 | 00011000100000 | |
| A | 10101000 | 00010111100000 | |
| A | 10101001 | 00010110100000 | |
| A | 10101010 | 00010100100000 | |
| A | 10101011 | 00010011100000 | |
| A | 10101100 | 00010010100000 | |
| A | 10101101 | 00010001100000 | |
| A | 10101110 | 00010001100000 | |
| A | 10101111 | 00010000100000 | 1056 |
| A | 10110000 | 00001111110000 | |
| A | 10110001 | 00001111010000 | |
| A | 10110010 | 00001110110000 | |
| A | 10110011 | 00001110010000 | |
| A | 10110100 | 00001101110000 | |
| A | 10110101 | 00001101010000 | |
| A | 10110110 | 00001100110000 | |
| A | 10110111 | 00001100010000 | |
| A | 10111000 | 00001011110000 | |
| A | 10111001 | 00001011010000 | |
| A | 10111010 | 00001010110000 | |
| A | 10111011 | 00001010010000 | |
| A | 10111100 | 00001001110000 | |
| A | 10111101 | 00001001010000 | |
| A | 10111110 | 00001000110000 | |
| A | 10111111 | 00001000010000 | 528 |

FIGURE 9  PRIOR ART

| | | | |
|---|---|---|---|
| A | 11000000 | 00000111111000 | |
| A | 11000001 | 00000111101000 | |
| A | 11000010 | 00000111011000 | |
| A | 11000011 | 00000111001000 | |
| A | 11000100 | 00000110111000 | |
| A | 11000101 | 00000110101000 | |
| A | 11000110 | 00000110011000 | |
| A | 11000111 | 00000110001000 | |
| A | 11001000 | 00000101111000 | |
| A | 11001001 | 00000101101000 | |
| A | 11001010 | 00000101001000 | |
| A | 11001011 | 00000100111000 | |
| A | 11001100 | 00000100101000 | |
| A | 11001101 | 00000100011000 | |
| A | 11001110 | 00000100011000 | |
| A | 11001111 | 00000100001000 | 264 |
| A | 11010000 | 00000011111100 | |
| A | 11010001 | 00000011110100 | |
| A | 11010010 | 00000011101100 | |
| A | 11010011 | 00000011100100 | |
| A | 11010100 | 00000011011100 | |
| A | 11010101 | 00000011010100 | |
| A | 11010110 | 00000011001100 | |
| A | 11010111 | 00000011000100 | |
| A | 11011000 | 00000010111100 | |
| A | 11011001 | 00000010110100 | |
| A | 11011010 | 00000010101100 | |
| A | 11011011 | 00000010100100 | |
| A | 11011100 | 00000010011100 | |
| A | 11011101 | 00000010010100 | |
| A | 11011110 | 00000010001100 | |
| A | 11011111 | 00000010000100 | 132 |

FIGURE 10 PRIOR ART

|   |   |   |   |   |
|---|---|---|---|---|
|   | A | 11011111 | 00000010000100 | 132 |
|   | A | 11100000 | 00000001111110 |   |
|   | A | 11100001 | 00000001111010 |   |
|   | A | 11100010 | 00000001110110 |   |
|   | A | 11100011 | 00000001110010 |   |
|   | A | 11100100 | 00000001101110 |   |
|   | A | 11100101 | 00000001101010 |   |
|   | A | 11100110 | 00000001100110 |   |
|   | A | 11100111 | 00000001100010 |   |
|   | A | 11101000 | 00000001011110 |   |
|   | A | 11101001 | 00000001011010 |   |
|   | A | 11101010 | 00000001010110 |   |
|   | A | 11101011 | 00000001010010 |   |
|   | A | 11101100 | 00000001001110 |   |
|   | A | 11101101 | 00000001001010 |   |
|   | A | 11101110 | 00000001000110 |   |
|   | A | 11101111 | 00000001000010 | 66 |
|   | A | 11110000 | 00000000111110 |   |
|   | A | 11110001 | 00000000111010 |   |
|   | A | 11110010 | 00000000110110 |   |
|   | A | 11110011 | 00000000110010 |   |
|   | A | 11110100 | 00000000101110 |   |
|   | A | 11110101 | 00000000101010 |   |
|   | A | 11110110 | 00000000100110 |   |
|   | A | 11110111 | 00000000100010 |   |
|   | A | 11111000 | 00000000011110 |   |
|   | A | 11111001 | 00000000011010 |   |
|   | A | 11111010 | 00000000010110 |   |
|   | A | 11111011 | 00000000010010 |   |
|   | A | 11111100 | 00000000001110 |   |
|   | A | 11111101 | 00000000001010 |   |
|   | A | 11111110 | 00000000000110 |   |
| +0 | A | 11111111 | 00000000000010 |   |

|  |   |   |   |
|---|---|---|---|
|  | A | 00011111 | 110111110000000 |
|  | A | 00011110 | 110111010000000 |
|  | A | 00011101 | 110110110000000 |
|  | A | 00011100 | 110110010000000 |
|  | A | 00011011 | 110101110000000 |
|  | A | 00011010 | 110101010000000 |
|  | A | 00011001 | 110100110000000 |
|  | A | 00011000 | 110100010000000 |
|  | A | 00010111 | 110011110000000 |
|  | A | 00010110 | 110011010000000 |
|  | A | 00010101 | 110010110000000 |
|  | A | 00010100 | 110010010000000 |
|  | A | 00010011 | 110001110000000 |
|  | A | 00010010 | 110001010000000 |
|  | A | 00010001 | 110000110000000 |
|  | A | 00010000 | 110000010000000 |
|  | A | 00001111 | 101111100000000 |
|  | A | 00001110 | 101110100000000 |
|  | A | 00001101 | 101101100000000 |
|  | A | 00001100 | 101100100000000 |
|  | A | 00001011 | 101011100000000 |
|  | A | 00001010 | 101010100000000 |
|  | A | 00001001 | 101001100000000 |
|  | A | 00001000 | 101000100000000 |
|  | A | 00000111 | 100111100000000 |
|  | A | 00000110 | 100110100000000 |
|  | A | 00000101 | 100101100000000 |
|  | A | 00000100 | 100100100000000 |
|  | A | 00000011 | 100011100000000 |
|  | A | 00000010 | 100010100000000 |
|  | A | 00000001 | 100001100000000 |
| −127 | A | 00000000 | 100000100000000 |

CO PART POSSIBLE IN COMMON
PARTIALLY BETWEEN EACH SELECTOR

PARALLEL-TO-SERIAL DATA CONVERSION CIRCUIT

BACKGROUND OF THE INVENTION

1. Field of the Invention

The present invention relates to a parallel-to-serial conversion circuit, and more specifically to a circuit for converting a PCM code to a 2'complement code in accordance with a so called "A-law regulation".

2. Description of Related Art

A conventional parallel-to-serial data conversion circuit for converting an 8-bit parallel data of PCM code to a 14-bit serial data of 2'complement in accordance with the "A-law regulation" is composed of shift registers (See for example, Document: "Digital Electric Circuit" (Japanese language)/ SHOKODO (Inc,) in Japan, pp 132–135) in accordance with "13-segment A-law regulation decoding table (See for example, Document: "Transmission Engineering" (Japanese language)/Ohm Company in Japan, pp 132–141)).

One example of a specific construction of the prior art conversion circuit is shown in the block diagram of FIG. 1. As shown in FIG. 1, The parallel-to-serial data converter is composed of an 8-bit input/14-bit output decoder DCB10 which receives an 8-bit parallel PCM input dam I(7), I(6), . . . , I(1), I(0), and a shift register SRB10 which receives a clock signal (CLOCK), a store signal (STORE) and a load signal (LOAD) and a 14-bit output data d(13), d(12),. . . , d(1), d(0) of the DCB10 and which outputs a 14-bit serial data of 2'complement code to an output terminal OUT.

Now, operation of this circuit. Will be explained with reference to FIGS. 2 to 4, a combination of which illustrates, as a whole, a detailed circuit diagram of the circuit shown in FIG. 1. Wiring conductors shown in FIG. 2 and designated with Reference Numerals 1 to 30 are connected to wiring conductors shown in FIG. 3 and designated with the same Reference Numerals, and wiring conductors shown in FIG. 3 and designated with Reference Numerals 31 to 39 are connected to wiring conductors shown in FIG. 4 and designated with the same Reference Numerals.

As shown in FIGS. 2 to 4, the conversion circuit includes selectors SE50 to SE54 and SE58 to SE62 which receive the 8-bit parallel PCM input data I(7), I(6), . . . , I(1), I(0), an inverter I30, an AND gate A30, an OR gate O30, selectors SE30 to SE32 and SE39 to SE42 controlled by the store signal, D-type latches D43 to D40 and D32 to D30, which are connected as shown in FIGS. 2 to 4. Further, the conversion circuit includes the output terminal OUT connected to a Q output of the D-type latch D30, for outputting the 14-bit serial data of 2'complement code (LSB first).

FIGS. 5 and 6 show timing; charts illustrating an operation of circuits shown in FIGS. 2 to 4. More specifically, FIG. 5 shows waveforms of the clock signal CLOCK, the: store signal STORE, the load signal LOAD, the 8-bit PCM parallel data input I(7) to I(0), and the output data d(13), d(12), d(11) of the decoder DCB10 by using the CLOCK signal as a reference. The successive output data d(10), d(9), . . . , d(0) of the DCB10 and the signal on the output terminal OUT (serial data output of 2'complement code) are shown in FIG. 6. One timing chart is shown by a combination of FIG. 5 and FIG. 6. Now, only the data d(11) is shown in both of FIG. 5 and FIG. 6. In FIG. 5 and FIG. 6, "1" and "0" are indicative of a logical value.

A table for convening the 8-bit PCM code into the 2'complement code is shown in FIGS. 7 to 14. In FIG. 7 to FIG. 14, "A-law regulation", PCM code, 2'complement (14 bits) are shown in order.

The data of an 8-bit PCM code is converted to a parallel data of 2'complement code, excepting for the MSB bit and the LSB bits, in accordance with the "A-law regulation" shown in FIGS. 7 to 14, by the parallel data bits I(4), I(5), I(6) and I(7) of the 8-bit PCM code, and also by the selectors SE50 to SE62 selecting a "L" (low) level (GND), a "H" (high) level (VDD) and the parallel data bits I(3), I(2), I(1), I(0) of the 8-bit PCM code. The LSB bit is ceaselessly at the "L" level, and the MSB bit is an output of the inverter 30 which inverts the parallel data bit I(7) of the 8-bit PCM code. The outputs d(0) to d(12) of the selectors SE50 to SE62 are inputted into the A terminal of the selectors SE30 to SE42. The terminal B of the selectors SE50 to SE62 receives the outputs of the latches D30 to D43, which in turn receive as a clock signal an AND signal of a predetermined clock signal CLOCK and a predetermined load signal LOAD. A predetermined store signal STORE is inputted into a select input S of the selectors SE30 to SE42.

If the predetermined STORE signal is applied, the selectors SE30 to SE42 select their A input, and the A inputs are supplied into the latches D30 to D42, respectively. The output D(13) of the inverter 130 (that is the inverted signal of the input 8-bit PCM code parallel data bit I(7)) is latched into the latch D43. The selectors SE30 to SE42 select their B input when the predetermined LOAD signal is applied, and the 14-bit serial output data of 2'complement code is outputted from the latch D30 in an "LSB-First" fashion.

As will be apparent from the above description, the conventional parallel-to-serial data conversion circuit for converting an 8-bit PCM code parallel data to a 14-bit serial data of 2'complement code, requires the 8-bit input/14-bit output decoder to have a complicated circuit construction. Therefore, the circuit scale is large. In addition, since the PCM code is converted to the 2'complement code while maintaining the parallel data, the latches of the number corresponding to the bit number of the outputs data of 2'complement code (14 bits) are required for converting the parallel data into the serial data. Accordingly, the circuit scale becomes even larger.

SUMMARY OF THE INVENTION

Accordingly, it is an object of the present invention to provide a parallel-to-serial data conversion circuit which has overcome the above mentioned defect of the conventional one.

Another object of the present invention is to provide a parallel-to-serial data conversion circuit having a reduced circuit scale.

The above and other objects of the present invention are achieved in accordance with the present invention by a parallel-to-serial data conversion circuit including a control circuit receiving a load signal, a clock signal and high-order 4 bits of a parallel data of 8-bit PCM code excluding the MSB bit, for generating a first control signal and a second control signal, a 6-bit shift register receiving the first control signal, the second control signal, low-order 4 bits of the parallel data, a store signal and the clock signal, and a selector for selecting the output of the shift register on the basis of the MSB bit and the first control Signal.

In a preferred embodiment, the parallel-to-serial data conversion circuit in accordance with the present invention is configured to convert a parallel input data of 8-bit PCM code composed of bits I(7), I(6), I(5), I(4), I(3), I(2), I(1) and I(0) in the order of a MSB bit to an LSB bit, to a 14-bit serial data of 2'complement code, in accordance with an "A-law regulation", and includes:

a control circuit receiving the bits bits I(6), I(5) and I(4), a dock signal, a store signal for fetching an input data, a load signal for outputting a converted data, the control circuit generating a first control signal for giving a first controlled logical level and also for a switching control, a second control signal for giving a second controlled logical level, and a shift dock;

a 6-bit shift register receiving the bits bits I(3), I(2), I(1) and I(0), the first control signal and the second control signal, and controlled by the first control signal and the shift clock so as to selectively shift out the bits bits I(3), I(2), I(1) and I(0), the first control signal and the second control signal; and a selector receiving an output of the shift register and controlled by the bit I(7) and the first control signal so as to selectively output the output of the shift register.

The above and other objects, features and advantages of the present invention will be apparent from the following description of preferred embodiments of the invention with reference to the accompanying drawings.

BRIEF DESCRIPTION OF THE DRAWINGS

Figure 11:
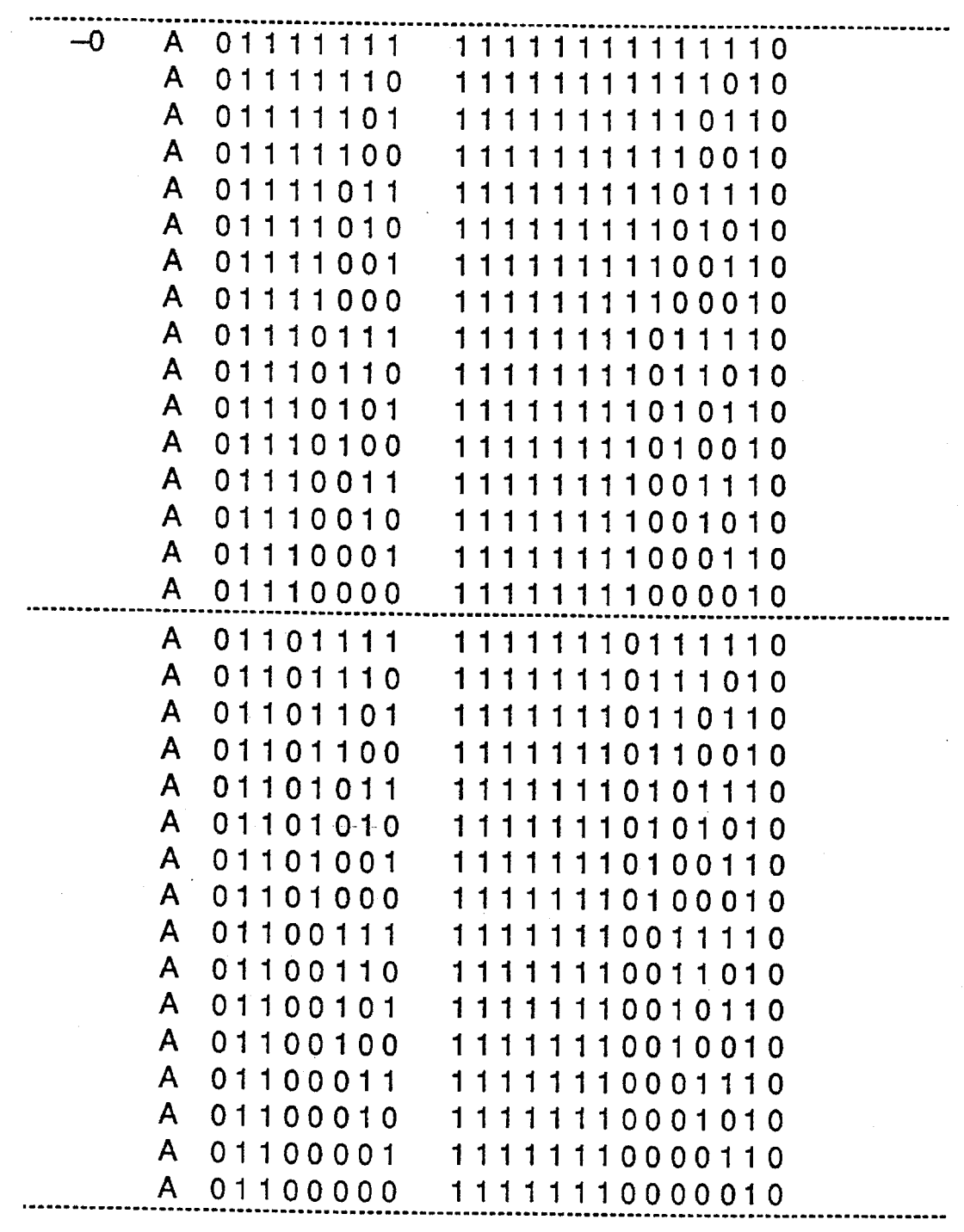
Figure 12:
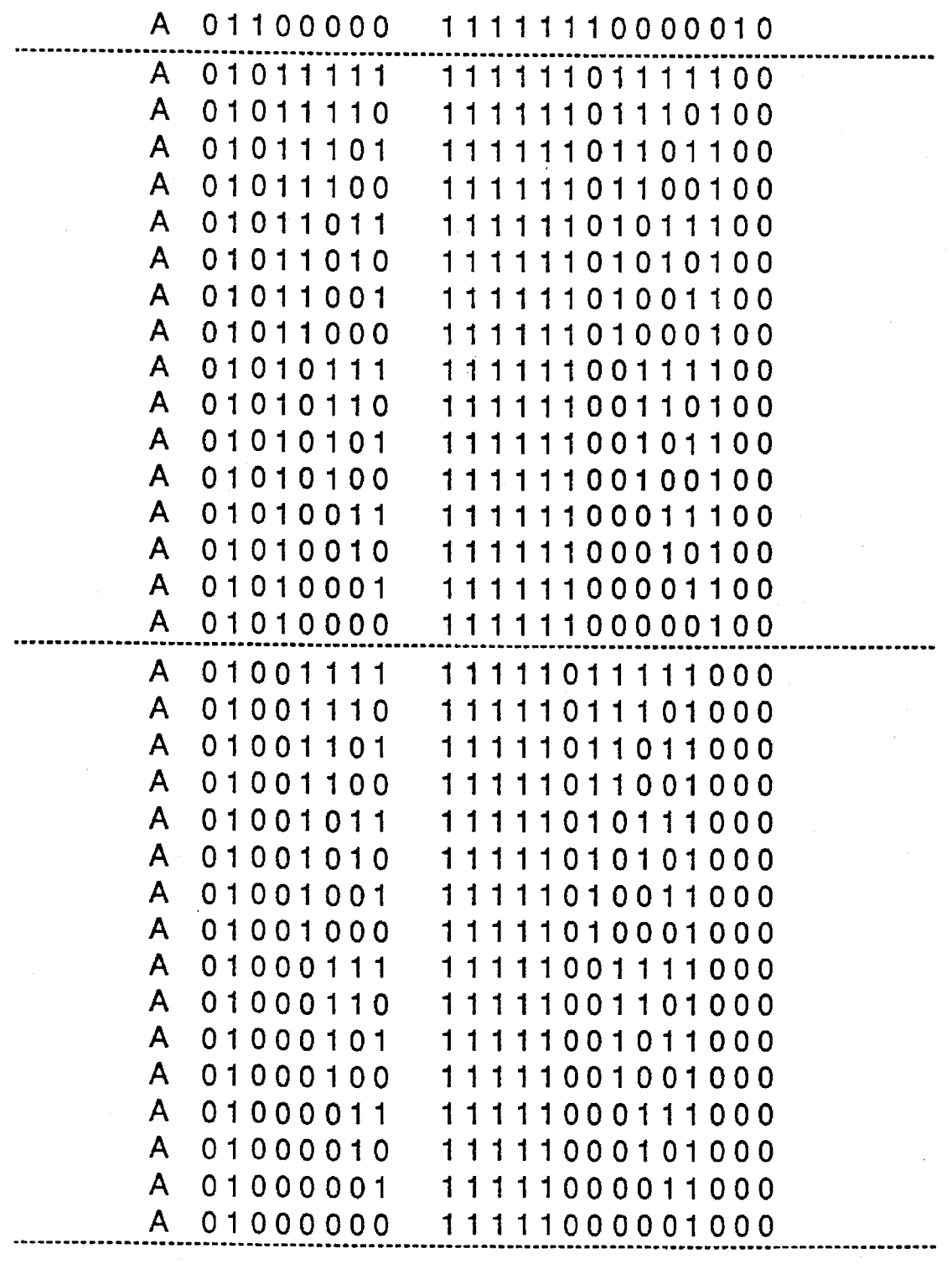
Figure 13:
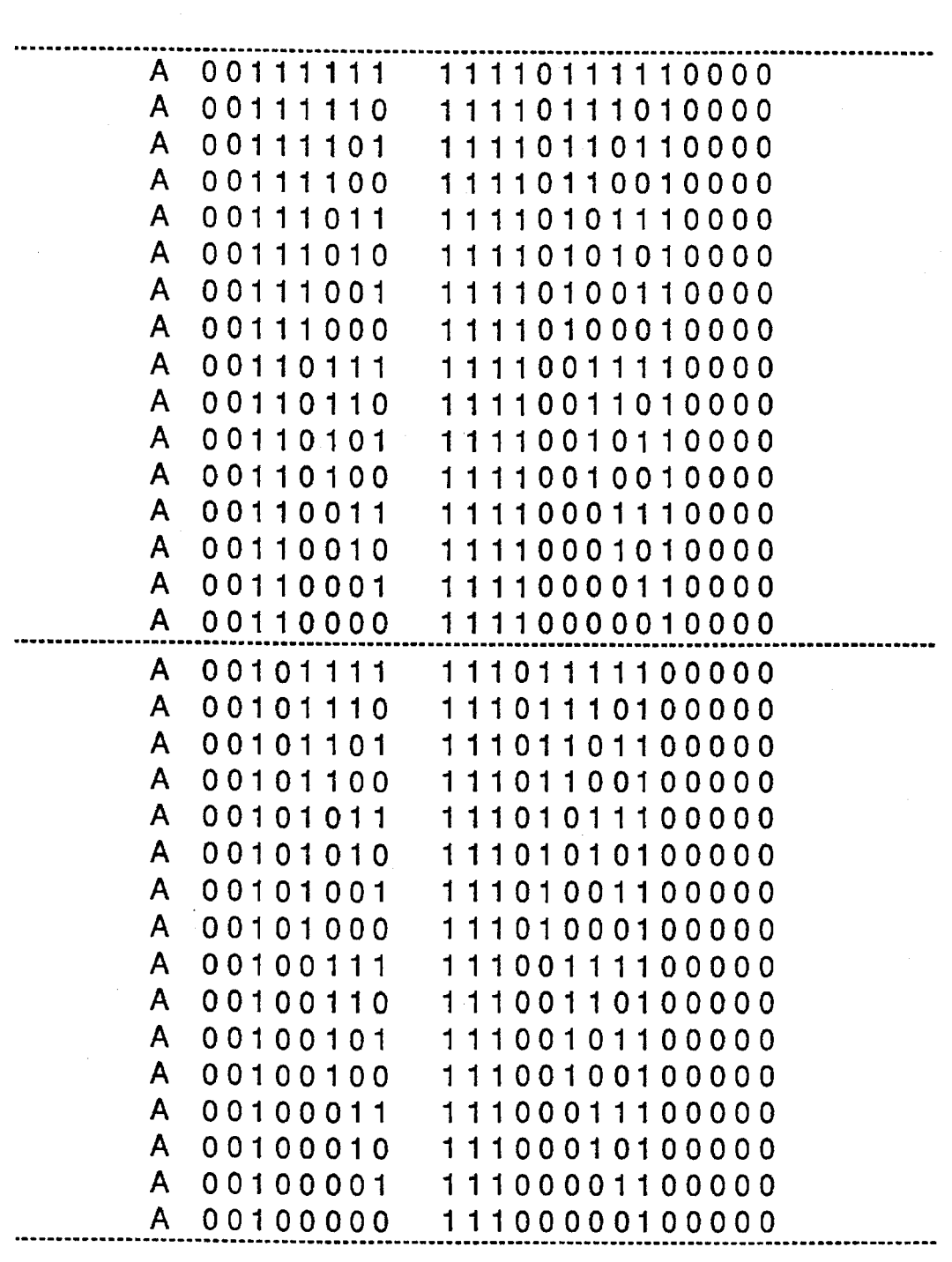

FIGS. 7 to 14 are a table for converting the 8-bit PCM code into the 2'complement code;

DESCRIPTION OF THE PREFERRED EMBODIMENTS

Figure 16:
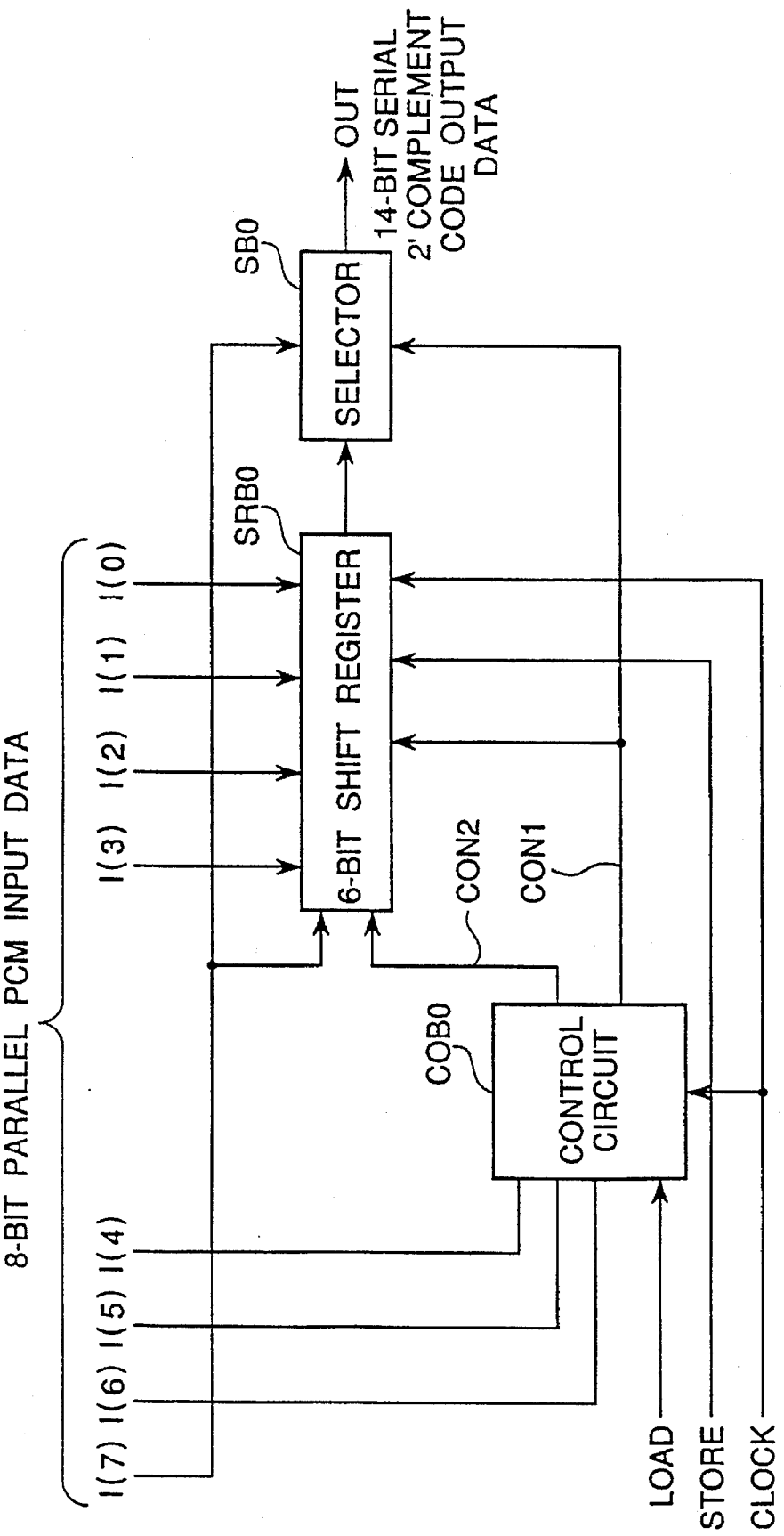
FIG. 16 is a block diagram of a first embodiment of the parallel-to-serial conversion circuit in accordance with the present invention.

Referring to FIG. 16, there is shown a block diagram of the first embodiment of present invention.

As shown in FIG. 16, the conversion circuit comprises a control circuit COB0 receiving a load signal LOAD, a clock signal CLOCK and parallel data bits I(6), I(5) and I(4) of an 8-bit PCM code data, for generating a first control signal CON1 and a second control signal CON2, a 6-bit shift register SRB0 receiving parallel data bits I(7), I(3), I(2), I(1) and I(0) of the 8-bit PCM code data and the load signal LOAD and a clock signal CLOCK, and controlled by the first control signal CON1 and the second control signal CON2, and a selector SB0 for selecting the output of the shift register on the basis of the parallel data bit I(7) (MSB bit) and the first control signal CON1.

Here, the input data is the input data bits I(7) to I(1), I(0) of the 8-bit parallel OCM code, and the 14-bit serial data of 2'complement code is outputted from an output terminal OUT.

Namely, this embodiment is a parallel-to-serial data conversion circuit for converting the parallel data bits I(7), I(6) to I(0) of 8-bit PCM code (MSB is a bit I(7) and LSB is a bit I(0)) to a serial data of 2'complement code in accordance with the "A-law regulation". The STORE signal is used to fetch the input dam, and the LOAD signal is used to output a signal obtained by conversion.

After the LOAD signal is applied, the control circuit COB0 outputs, at first, the second control signal CON2 if all of data bits I(6), I(5) and I(4) of the 8-bit PCM code are "1". Then, after 7 clocks are counted, the control circuit COB0 outputs the first control signal CON1 to the 6-bit shift register SRB0 and the selector SB0. In cases other than the case in which all the data bits I(6), I(5) and I(4) of the 8-bit PCM code are "1", after clocks of 1+{a decimal number indicated by the 8-bit PCM code data bits I(6), I(5), I(4)} are counted, the control circuit outputs the first control signal CON1 to the 6-bit shift register SRB0 and the selector SB0.

In a case that the first control signal is: not outputted from the control circuit, the 6-bit shift register SRB0 maintains the 8-bit PCM code data bits I(7), I(3), I(2), I(1), I(0) and the second control signal CON2 in response to a predetermined STORE signal. In the case that the 8-bit PCM code data bit I(7) is at the "H" level, the selector SB0 outputs "0" until the first control signal CON1 is outputted. If the first control signal CON1 is outputted, the selector SB0 serially outputs, in an inverted form, the data held in the register in synchronism with a predetermined CLOCK signal in the named order of the 8-bit PCM code data signal bits I(7), I(3), I(2), I(1), I(0), and the second control signal CON2 of the control circuit. After the data held in the register is completely outputted, the selector SB0 outputs "0" again.

In the case that the 8-bit PCM code data I(7) is at the "L" level, the selector SB0 outputs "1" until the first control signal CON1 is outputted. If the first control signal CON1 is outputted, the selector SB0 serially outputs the data held in the register in synchronism with a predetermined CLOCK signal in the named order of the 8-bit PCM code data signal bits I(7), I(3), I(2), I(1), I(0), and the second control signal CON2 of the control circuit. After the data held in the register is Completely outputted, the selector SB0 outputs "1" again.

Now, the first embodiment will be explained with reference to a detailed circuit diagram and a timing chart.

Figure 17:
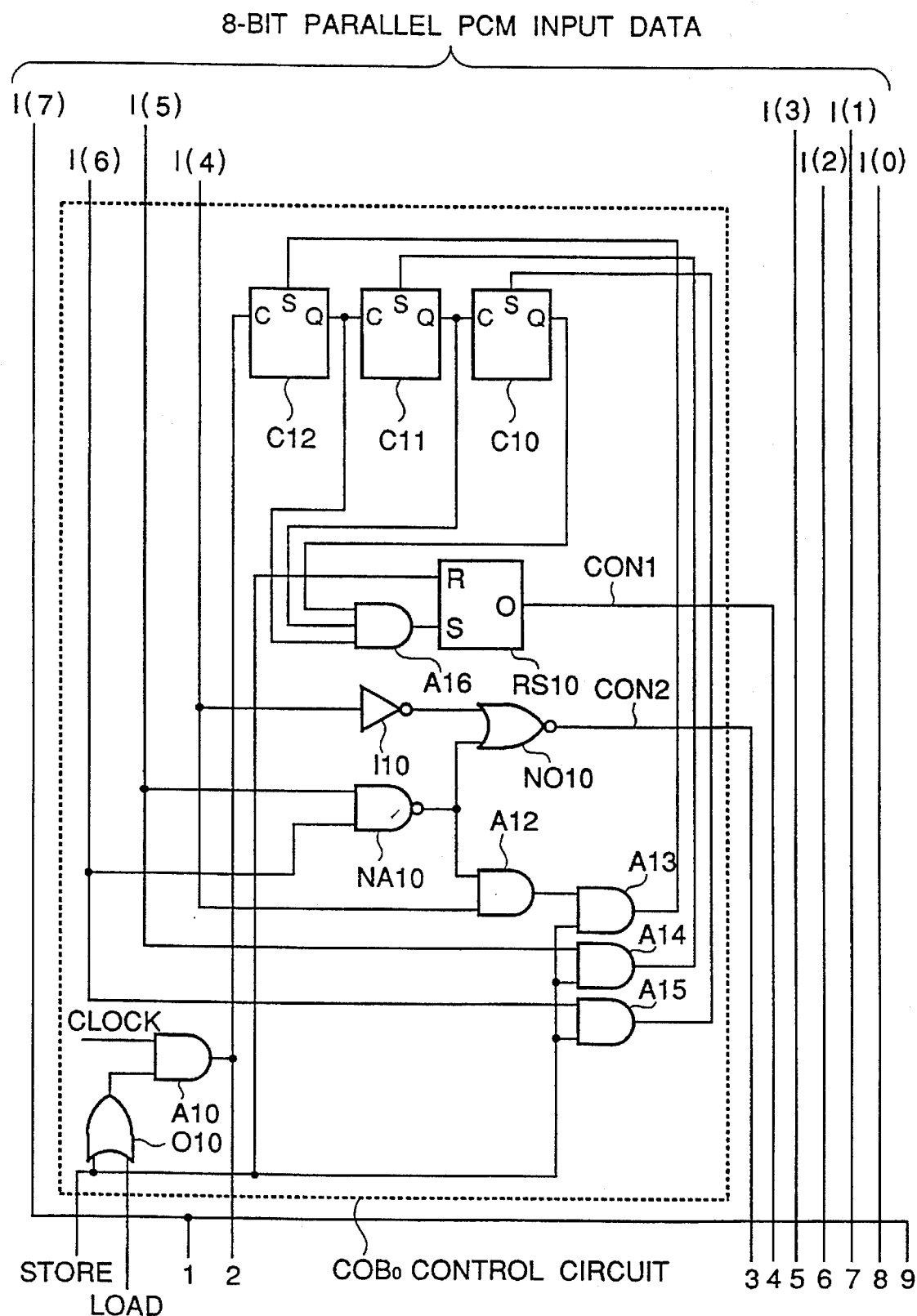
FIG. 17 is a detailed circuit diagram of a first part of the first embodiment of the parallel-to-serial conversion circuit shown in FIG. 16.
Figure 18:
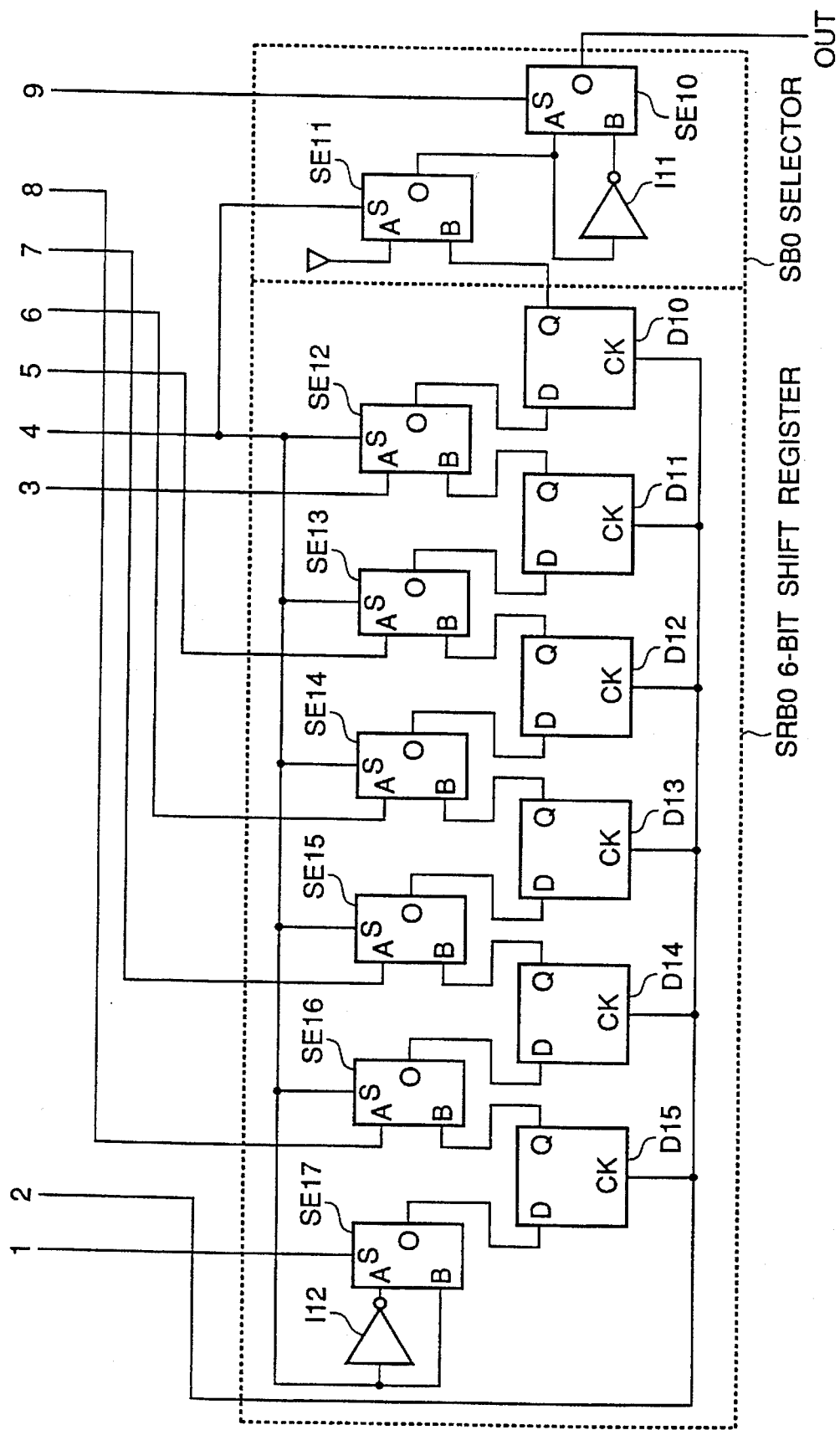
FIG. 18 is a detailed circuit diagram of a second part of the first embodiment of the parallel-to-serial conversion circuit shown in FIG. 16.

FIG. 17 and FIG. 18 show a detailed circuit diagram of the first embodiment shown in FIG. 16. Wiring conductors shown in FIG. 17 and given with Reference Numerals 1 to 9 are connected to wiring conductors shown in FIG. 18 and given with the same Reference Numerals. An overall circuit is shown in FIG. 17 and FIG. 18 combination.

As shown in FIG. 17 and FIG. 18, the control circuit OCB0 of the first embodiment is composed of AND gates A10, A12 to A16, and counters C10, C11 and C12, a flip-flop RS10, an inverter I10, a NAND gate NA10 and an OR gate O10, which are connected as shown. The selector SB0 of the first embodiment is composed of selectors SE10 and SE11 and an inverter I11, which are connected as shown, and the 6 bit shift register SRB0 of the first embodiment is composed of D type latches D15 to D10, selectors SE15 to SE10 and an inverter I12, which are connected as shown. The input data is the 8-bit parallel PCM data bits I(7) to I(0), and the output terminal OUT outputs a 14-bit serial data of of 2'complement code (MSB First).

Figure 19:
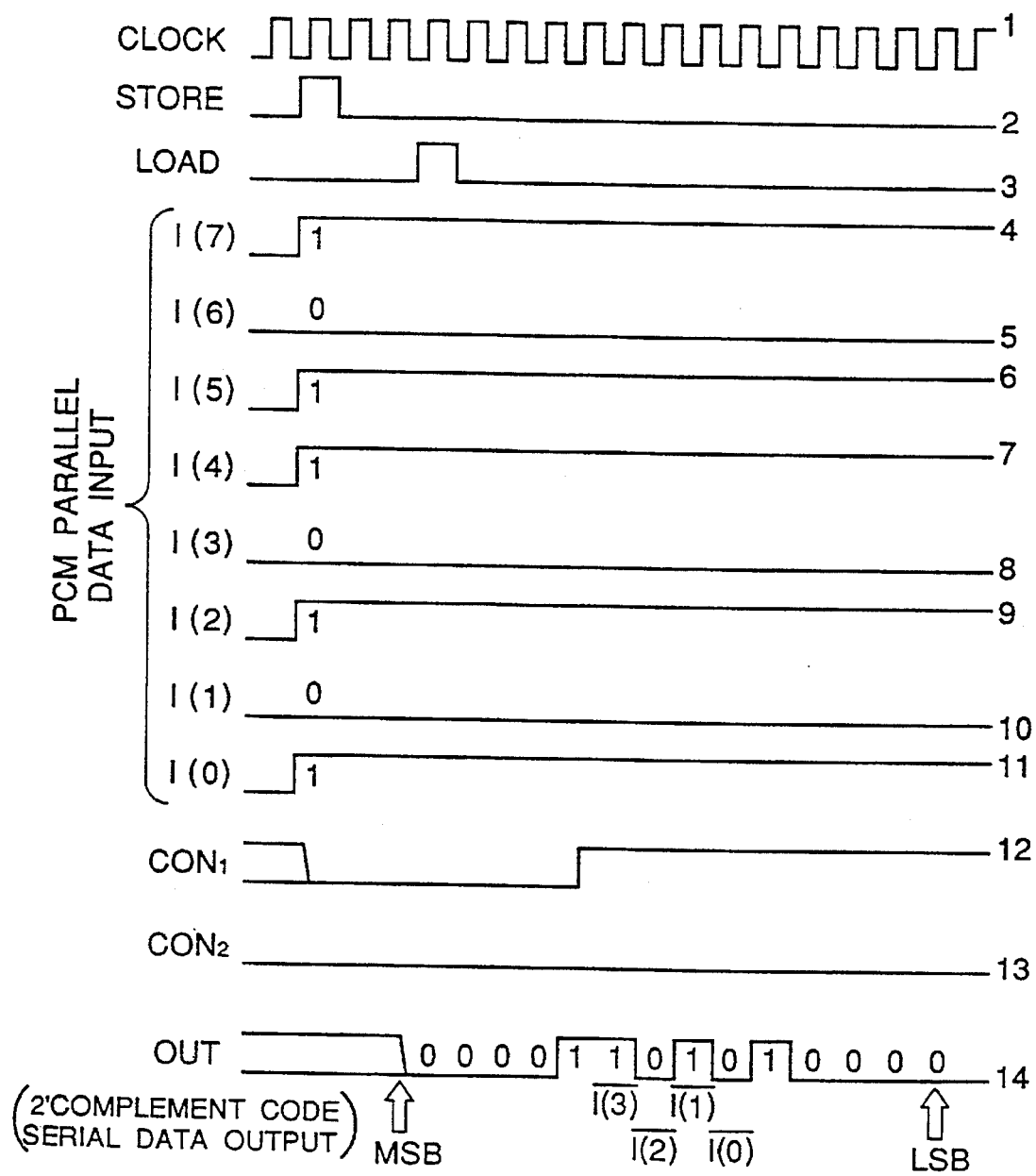
FIGS. 19 and 20 show a timing chart illustrating an operation of the first embodiment of the parallel-to-serial conversion circuit shown in FIG. 16.
Figure 20:
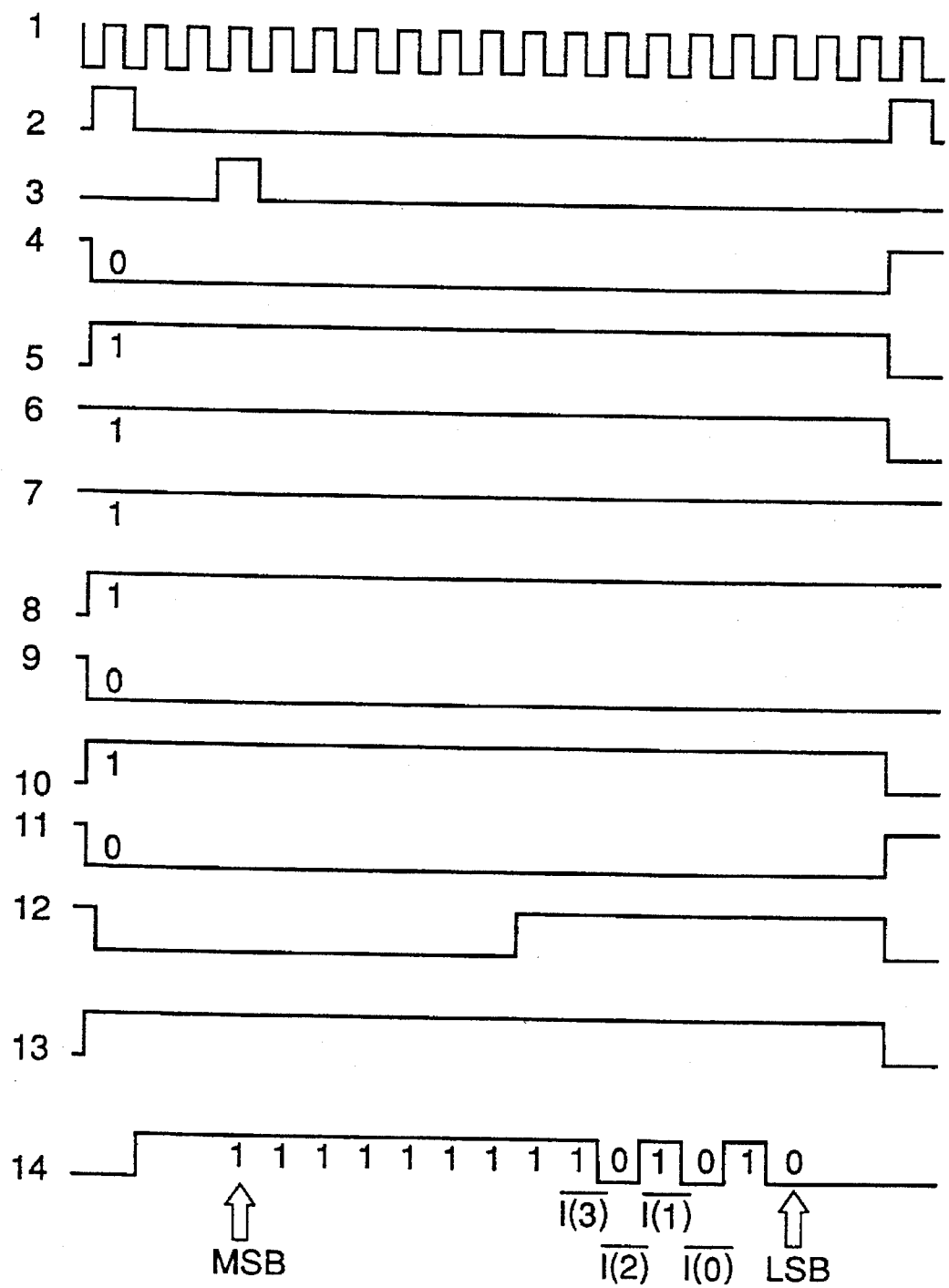

FIGS. 19 and 20 shows, in combination, a timing chart illustrating a specific operation of various circuits shown in. FIGS. 17 and 18. In FIGS. 19 and 20, various waveforms designated with Reference Numerals 1 to 14 in FIG. 19 are continuous to waveforms designated with the same Reference Numerals in FIG. 20. Namely, waves shown in FIG. 19 succeed to waves shown in FIG. 20. In FIGS. 19 and 20, the same Reference Numerals designate the same waves, respectively. In the first embodiment shown in FIGS. 17 to 20, the serial output is of the MSB First (the MSB bit is outputted at first and the LSB bit is outputted as a final bit).

The NAND gate NA10 negates a product of the parallel data bits I(6) and I(5) of the 8-bit PCM code, and the AND gate A12 outputs a product of an output signal of NAND gate NA10 and the parallel data bit I(4) of the 8-bit PCM code. The AND gate A13 outputs a product of an output of the AND gate 12 and the STORE signal. A set counter (counter having set terminal) C12 is set by an output signal of the AND gate A13. A set counter 11 is set by an output signal of the AND gate A14 which produces a product of the STORE signal and the parallel data bit I(5) of the 8-bit PCM code. A set counter 10 is set by an output signal of the AND gate A15 which produces a product of the STORE signal and the parallel data bit I(6) of the 8-bit PCM code.

The set down counter C10 to C12 having the set terminal counts an output of the AND gate A10, which generate, a product of the CLOCK signal and an output signal of the OR gate O10, which products a logical OR of the STORE signal and the LOAD signal. When all outputs of all stages of the set down counter C10 to C12 are "1", the output of the AND gate A16 is brought to the "H" level, which sets the RS latch RS10. At this time, the control signal CON1 is brought to the "H" level. Since RS latch RS10 is reset by the store signal, so that the control signal CON1 is brought to the "L" level.

The parallel data bit I(4) of the 8-bit PCM code is inverted by the inverter I10. The NOR gate NO10 negates a logic OR of an output of the NAND gate NA10 and an output of the inverter. I10. The output of this NOR gate NO10 is used as the control signal CON2. The control signal CON2 is brought to the "H" (high) level in a case that the 8-bit parallel PCM input data bits I(6), I(5) and I(4) are "1, 1, 1". In the other cases, the control signal CON2 is brought to the "L" (level) signal.

The parallel data bits I(3), I(2), I(1), I(0) of the 8 bit PCM code is supplied into the A input of the selectors SE13 to SE16, and the control signal CON1 is applied into the select signal terminal S of the selectors SE13 to SE16. In a case of the control signal CON1 of "H", the selectors SE13 to SE16 select their A input, and output the parallel data bits I(3), I(2), I(1), I(0) of the 8-bit PCM code The output data of these selectors is latched in the latches D11 to D14 when the output of the AND gate A10 is brought to the "H" level. At the same time, the control signal CON2 is latched in the latch D10.

When the parallel data bit I(7) of the 8-bit PCM code is at a "L" level, the control signal CON1 inverted by the inverter I12 is selected by the selector SE17, and held in the latch D15. On the other hand, the selector SE10 selects its A input, and during a "L" level period of the control signal CON1, the selector 11 selects its A input so as to output a "H" level.

When the control signal CON1 is brought to the "H" level, the selector SE11 to SE16 selects their B inputs and the selector SE10 successively outputs the output signals of the latches D10 to D15 and the output of the selector 17 at each time when the output of the AND gate A10 is brought to the "H" level. By this way, when the parallel data bit I(7) of the 8-bit PCM code is at the "L" level, the 14-bit serial data of 2'complement code is outputted in a MSB-First mode.

When the parallel data bit I(7) of 8-bit PCM code is at the "H" level, the selector SE17 selects its B input, and the control signal CON1 is outputted from the selector SE17, and the selector SE10 selects its B input, so that the output of the selector SE11 inverted by the inverter I11 is outputted from the selector SE10. By this way, when the parallel data bit I(7) of the 8-bit PCM code is at the "H" level, the 14-bit serial data of 2'complement code is outputted in a MSB-First mode.

By the above mentioned way, the parallel data of the 8-bit PCM code can be converted to the 14-bit MSB-First serial data of 2'complement code.

Figure 21:
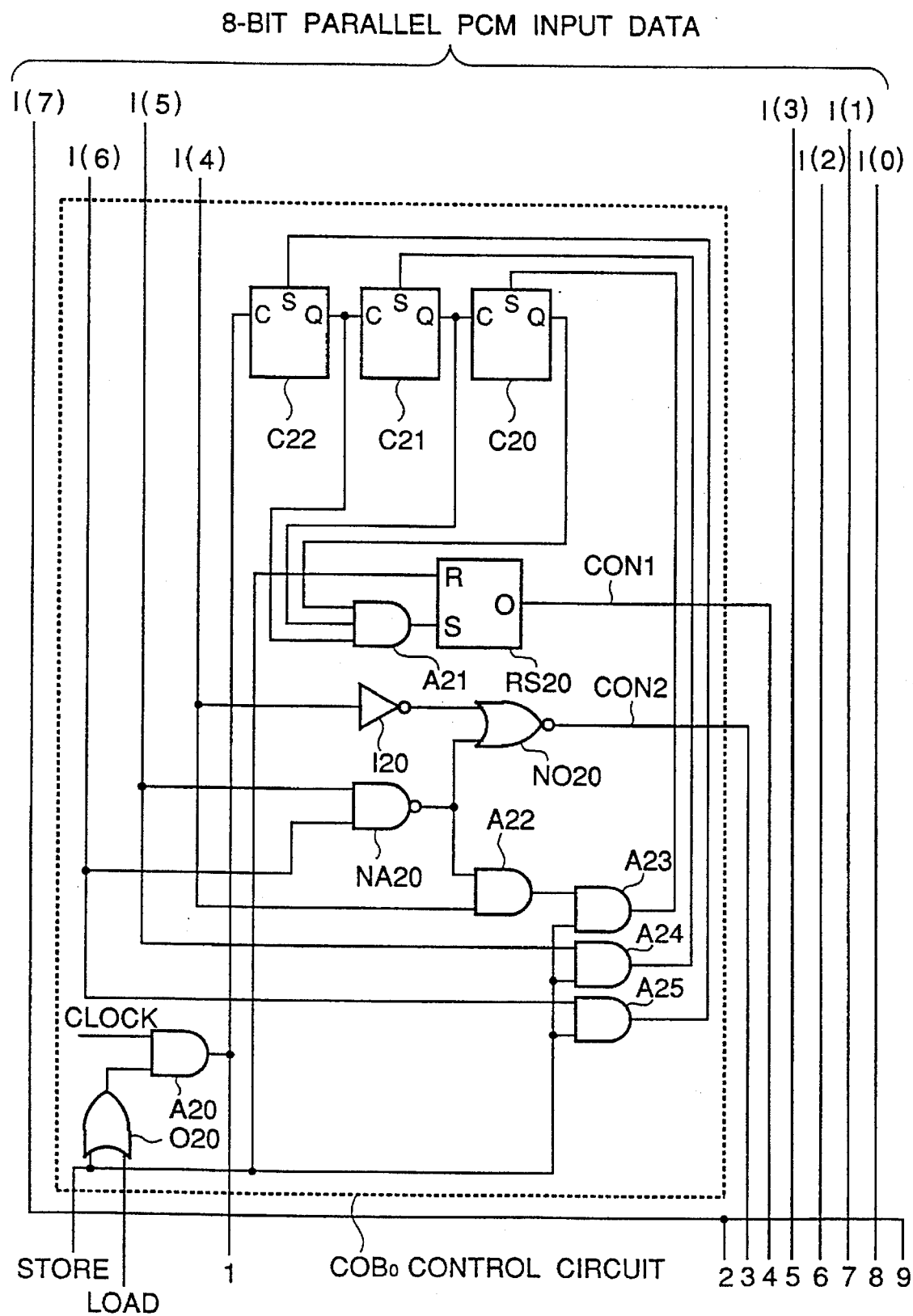
FIG. 21 is a detailed circuit diagram of a first part of a second embodiment of the parallel-to-serial conversion circuit in accordance with the present invention.
Figure 22:
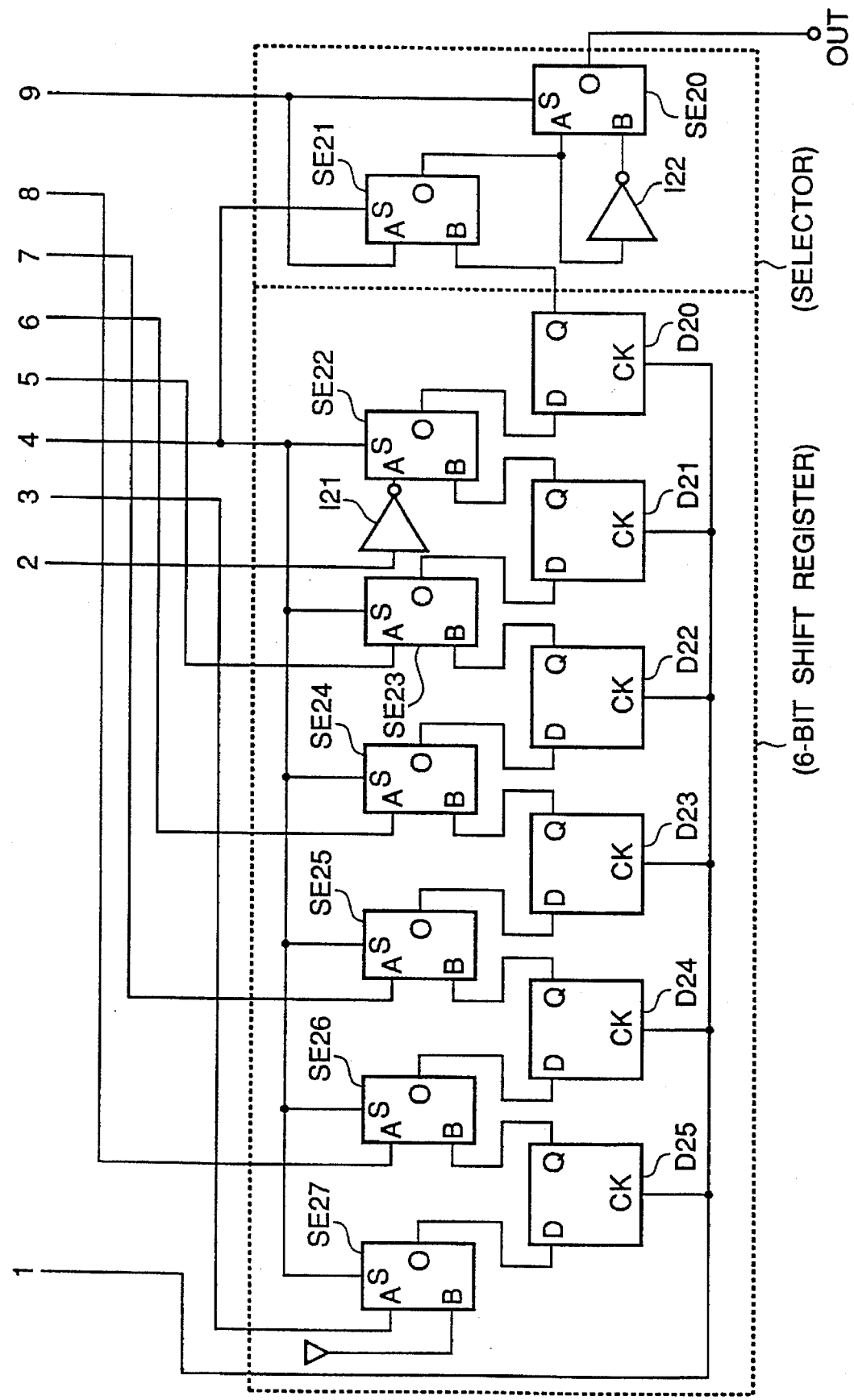
FIG. 22 is a detailed circuit diagram of a second part of a second embodiment of the parallel-to-serial conversion circuit in accordance with the present invention.

FIGS. 21 and 22 show the second embodiment of the present invention for outputting a serial data in a LSB-First mode. In FIGS. 21 and 22, wiring conductors designated by Reference Numerals 1 to 9 in FIG. 21 are connected to wiring conductors designated by the same Reference Numerals in FIG. 22. Therefore, a combination of FIGS. 21 and 22 shows one circuit diagram of the second embodiment as a whole. This second embodiment is configured to output the 14-bit serial data of 2'complement code in a LSB-First mode. Since a general functional block diagram of the second embodiment is the same as that of the first embodiment shown in FIG. 16, a construction and an operation of the general function will be omitted.

Figure 23:
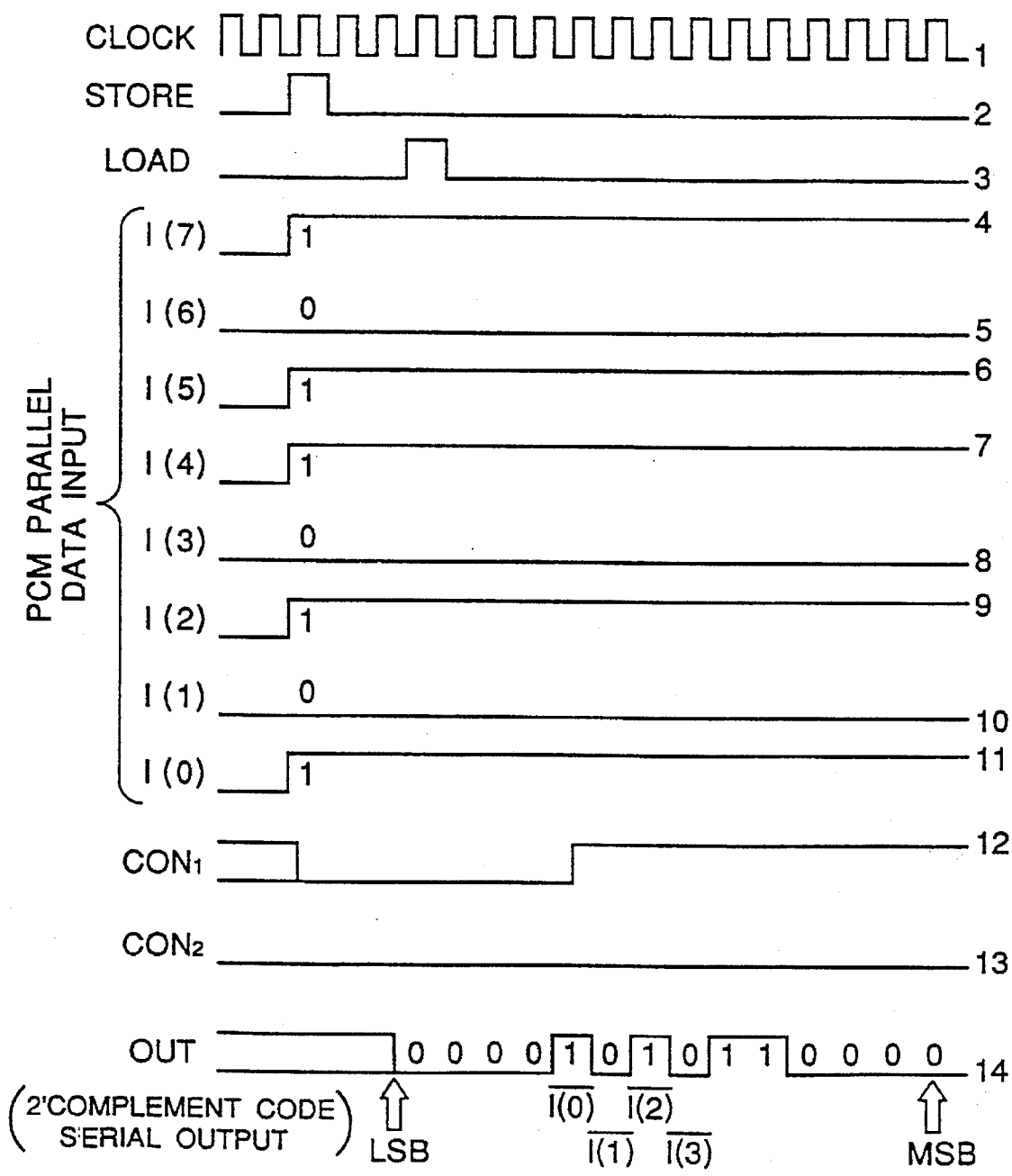
FIGS. 23 and 24 show a timing chart illustrating an operation of the second embodiment of the parallel-to-serial conversion circuit shown in FIGS. 21 and 22.
Figure 24:
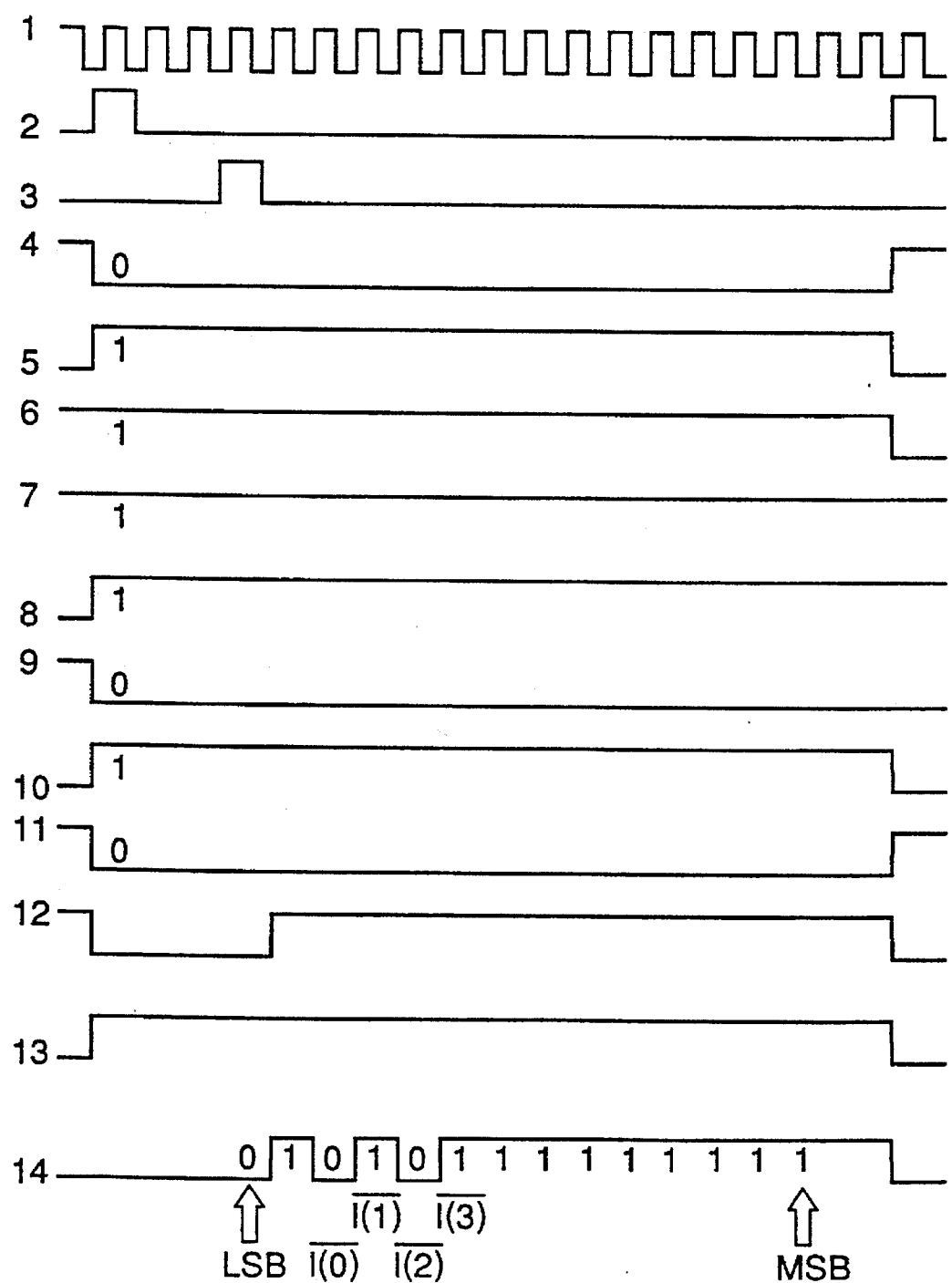

FIGS. 23 and 24 show, in combination, a timing chart illustrating a specific operation of the second embodiment showing in FIGS. 21 and 22. In FIGS. 23 and 24, various waveforms designated With Reference Numerals 1 to 14 in FIG. 23 are continuous to waveforms designated with the same Reference Numerals in FIG. 24. Namely, waves shown in FIG. 23 succeed to waves shown in FIG. 24.

In the second embodiment shown in FIGS. 21 to 24, parallel data bits I(6), I(5), I(4) of the 8-bit PCM code are set in an up-counter of 3 bits C22, C21, C20 when the STORE signal is supplied. However, in a case that all parallel data bits I(6), I(5), I(4) of the 8-bit PCM code are "1", only the bits C22 and C21 of the 3-bit up counter are set. Further, the control signal CON1 is brought to the "L" level, because the RS latch RS20 is reset.

At this time, the selectors SE22 to SE27 select their A input. And, since the control signal CON2 is at a "L" level in the case that the parallel data bits I(6), I(5), I(4) of the 8-bit PCM code are not all "1", the latch D25 latches the "L" level in response to a predetermined clock signal CLOCK. When the parallel data bits I(6), I(5), I(4) of the 8-bit PCM code are all "1", the control signal CON2 is brought to the "H" level, and therefore, the "H" level is latched in the latch D25 in response to a predetermined clock signal CLOCK. The latches D24–D21 hold the parallel data bits I(3) to I(0)

of the 8-bit PCM code in response to a predetermined clock signal CLOCK.

The latch D20 holds the parallel data bit I(7) of the 8-bit PCM code. Further, since the selector SE21 selects its A input, when the 8-bit parallel data bit I(7) of the PCM code is at the "L" level, the selector SE20 selects its A input so that the "L" level signal is outputted from the output terminal OUT. When the parallel data bit I(7) of the 8-bit PCM code is at the "H" level, the selector SE20 selects its B input so as to output an output signal of the inverter 122. Therefore, the "L" level signal is outputted from the output terminal OUT.

Next, when a predetermined LOAD signal is applied, the 3-bit counter C22 to C20 count up a predetermined CLOCK signal. When all bits C22 to C20 of the up counter are "1", the AND gate A21 outputs the "H" level, so that the RS latch RS20 is set and the control signal CON2 is brought to the high level.

At this time, the selectors SE21 to SE27 select their B input, so that the data held in the latches D20 to D25 are shifted out and outputted through the selector SE21. Since the B input of the selector SE27 is VDD("H" level), after all the data held in the latches D20 to D25 are shifted out, the "H" level is outputted through the selector SE21. If the data bit I(7) of the 8-bit parallel PCM code is at the "L" level, the selector SE20 outputs the output signal of the selector SE21 as it is. However, if the data bit I(7) of the 8-bit parallel PCM code is at the "H" level, the selector SE20 outputs the output of the selector SE21 inverted by the inverter I22.

As shown above, the parallel input data of 8-bit PCM code can be converted to a 14-bit LSB-First serial data of the 2'complement code.

Figure 1:
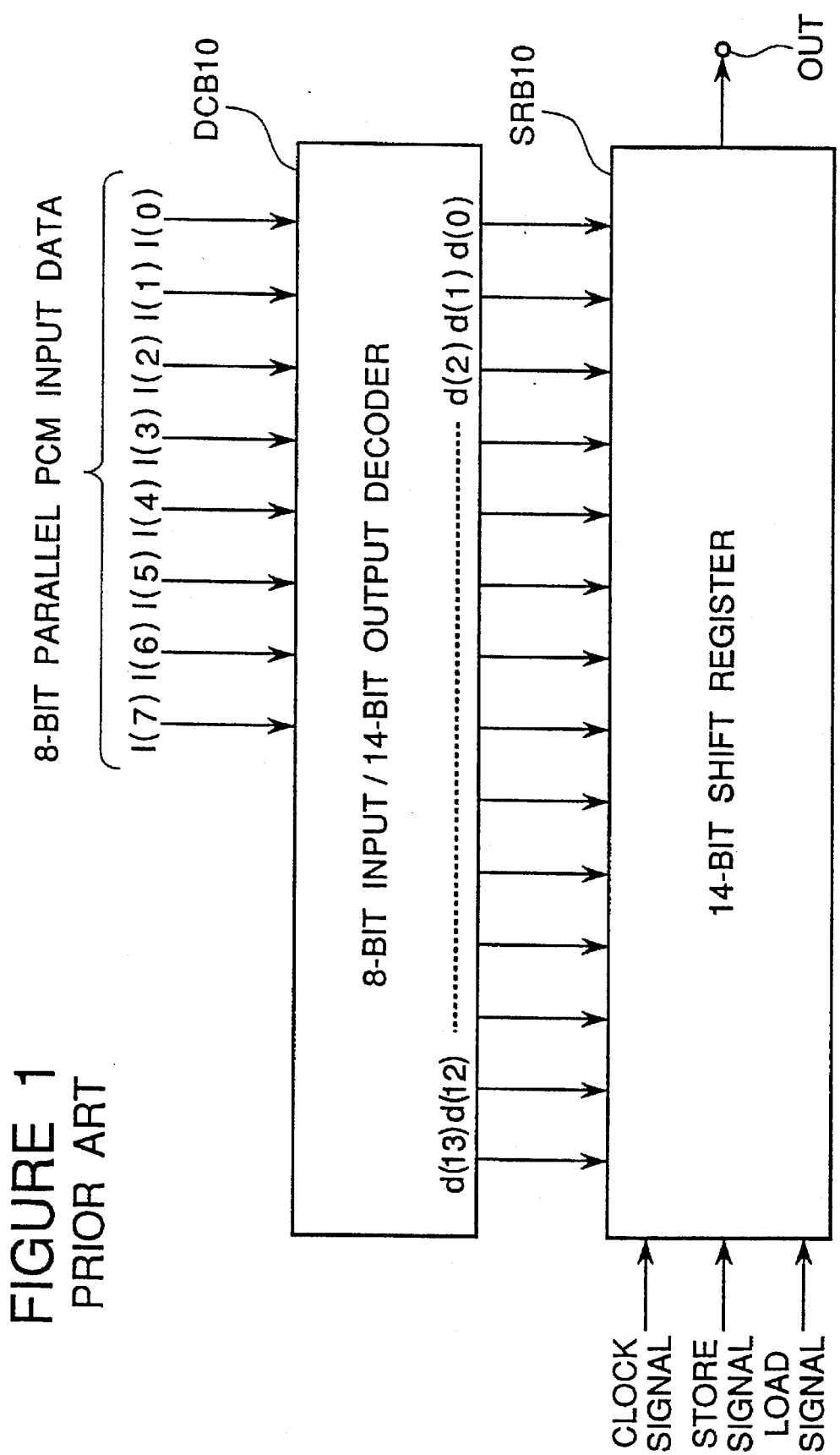
FIG. 1 is a block diagram of a conventional parallel-to-serial conversion circuit.
Figure 2:
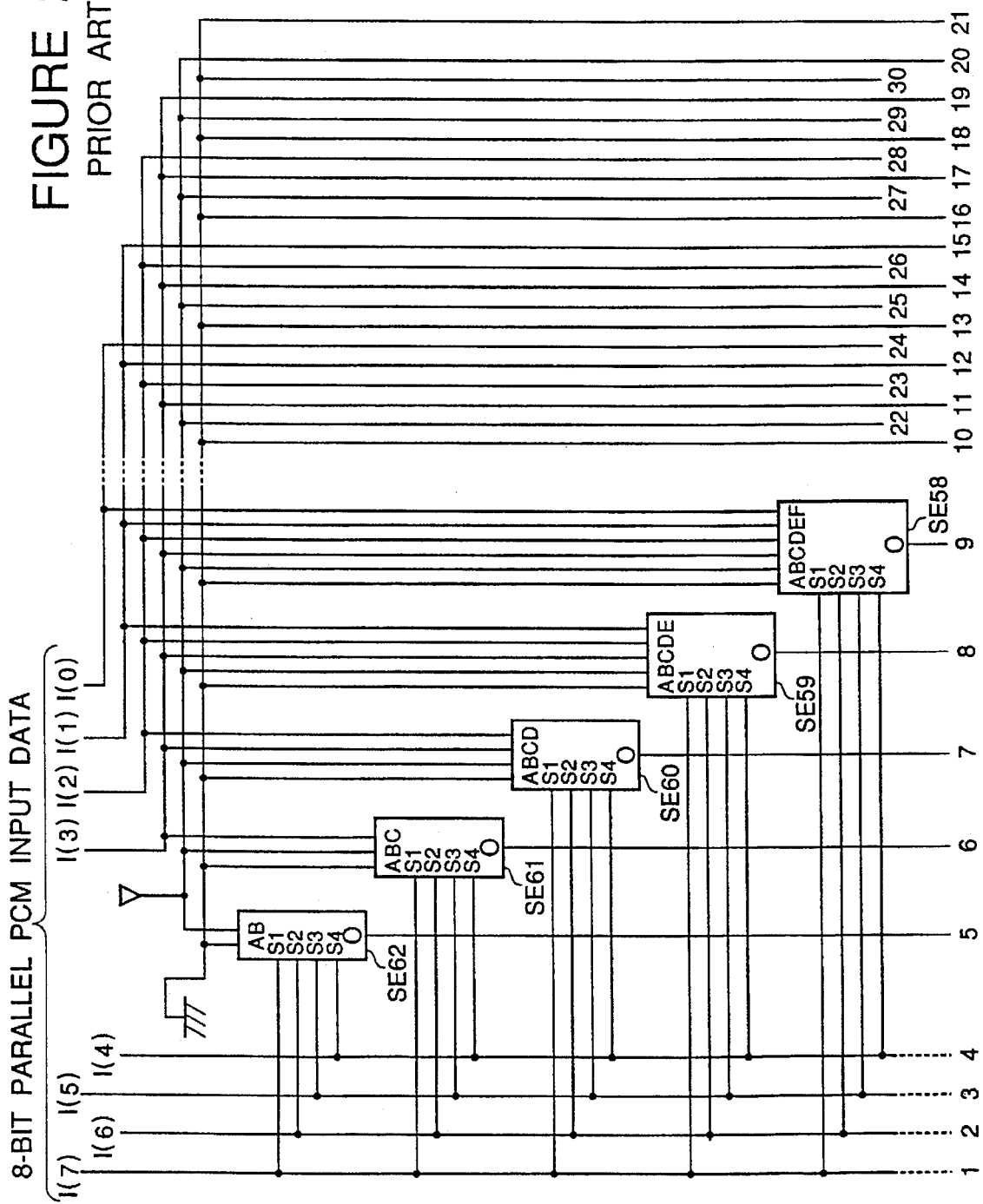
FIG. 2 is a detailed circuit diagram of a first part of the conventional parallel-to-serial conversion circuit shown in FIG. 1.
Figure 3:
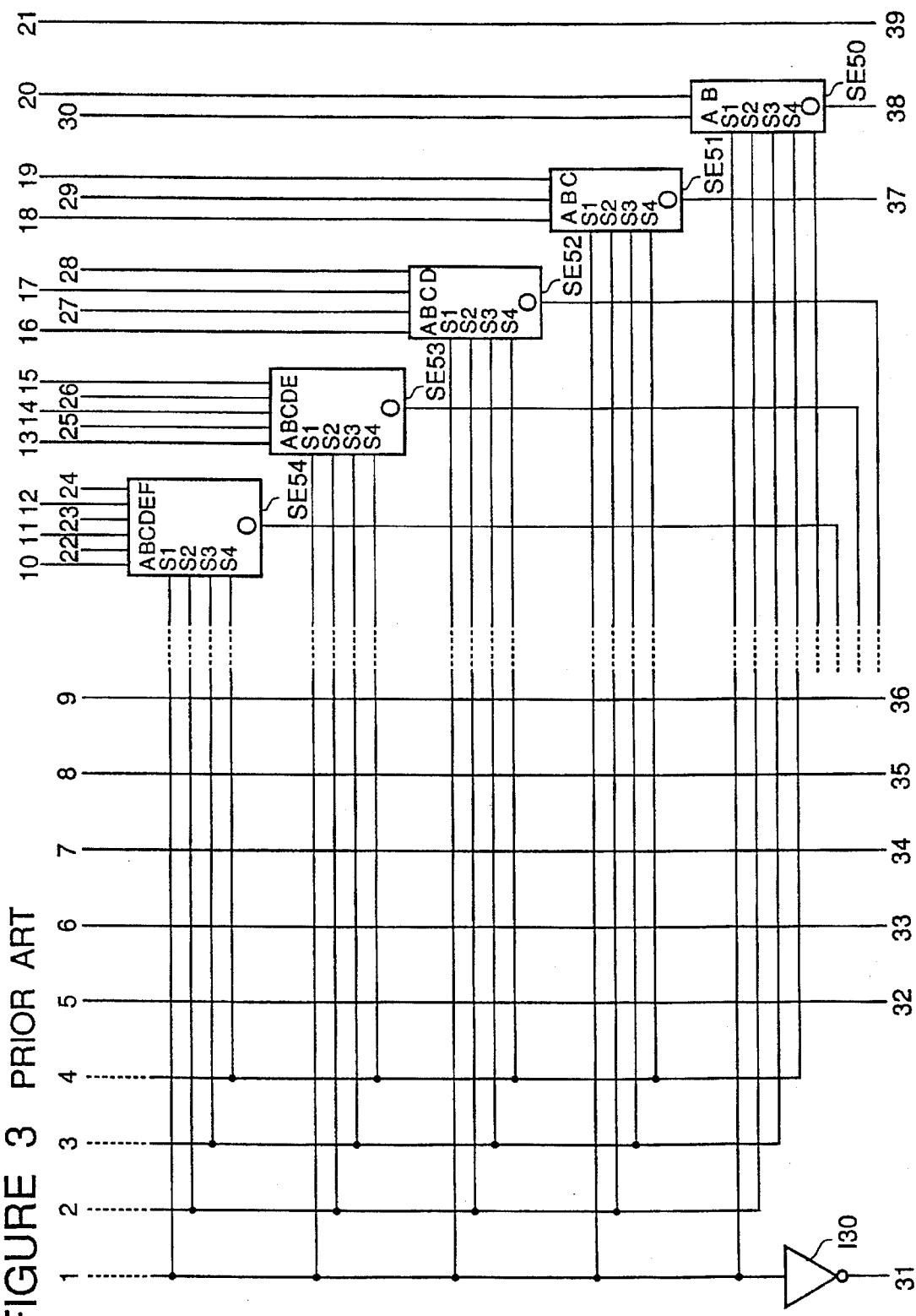
FIG. 3 is a detailed circuit diagram of a second part of the conventional parallel-to-serial conversion circuit shown in FIG. 1.
Figure 4:
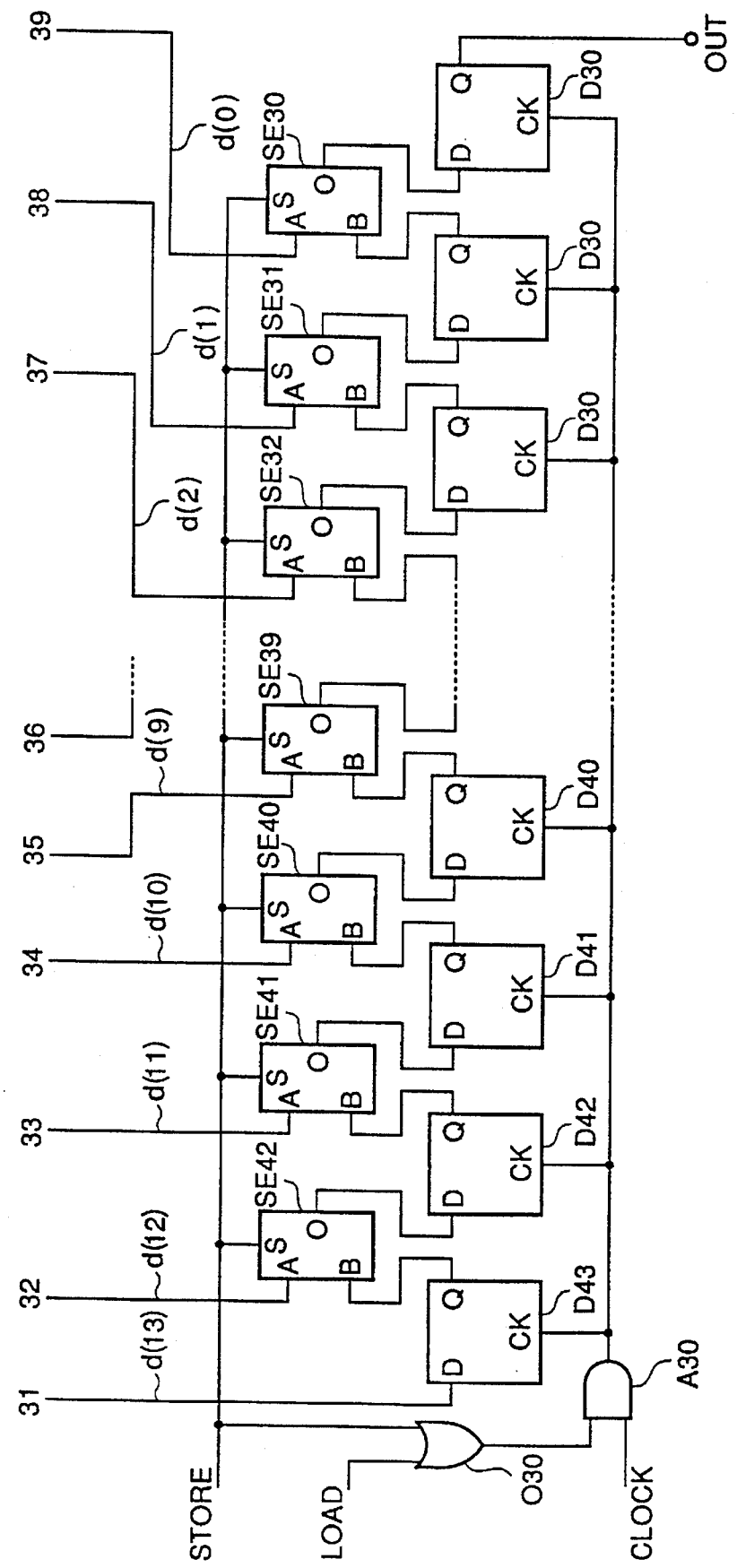
FIG. 4 is a detailed circuit diagram of a third part of the conventional parallel-to-serial conversion circuit shown in FIG. 1.
Figure 5:
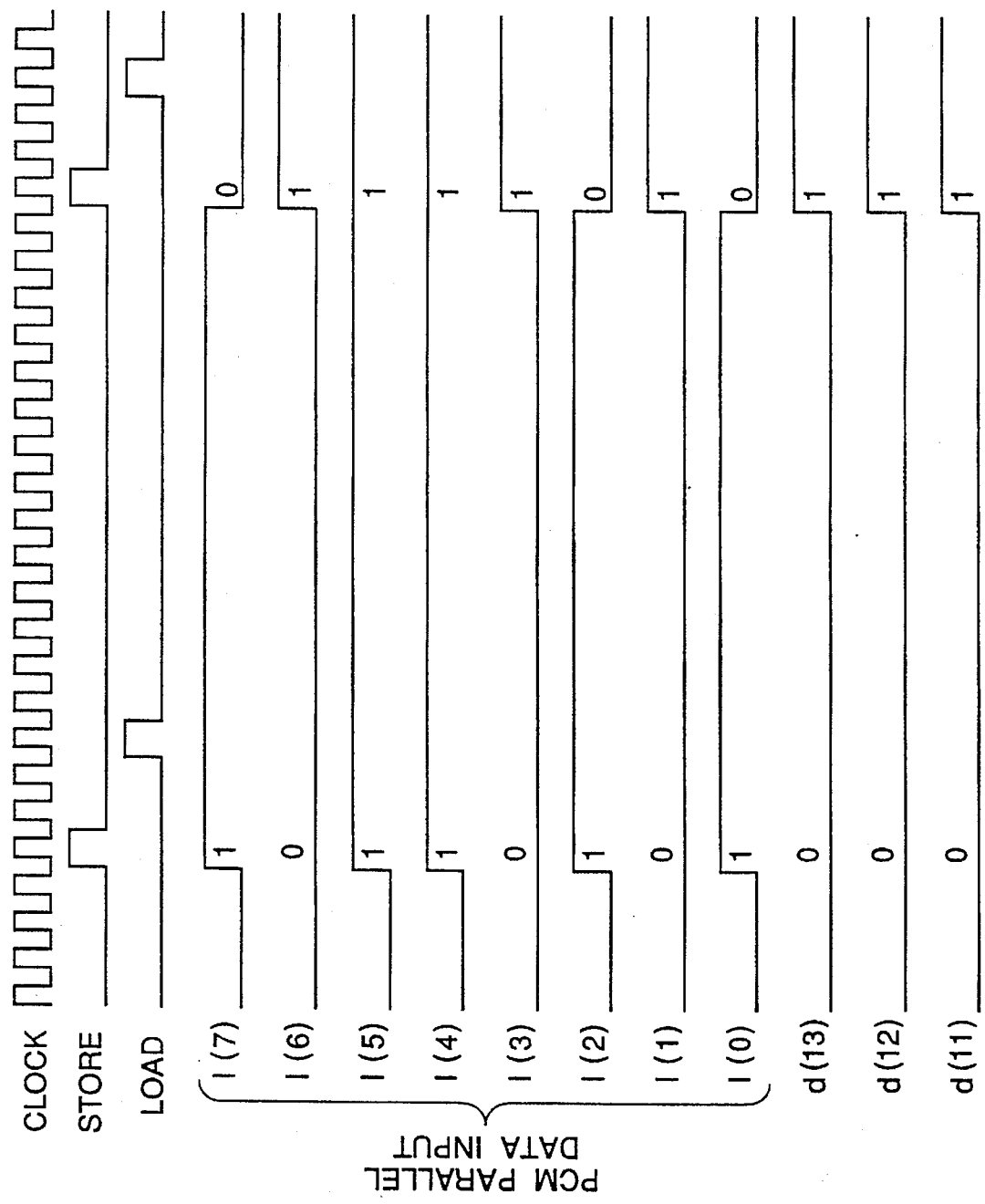
FIGS. 5 and 6 are timing charts of of the conventional parallel-to-serial conversion circuit shown in FIG. 1.
Figure 6:
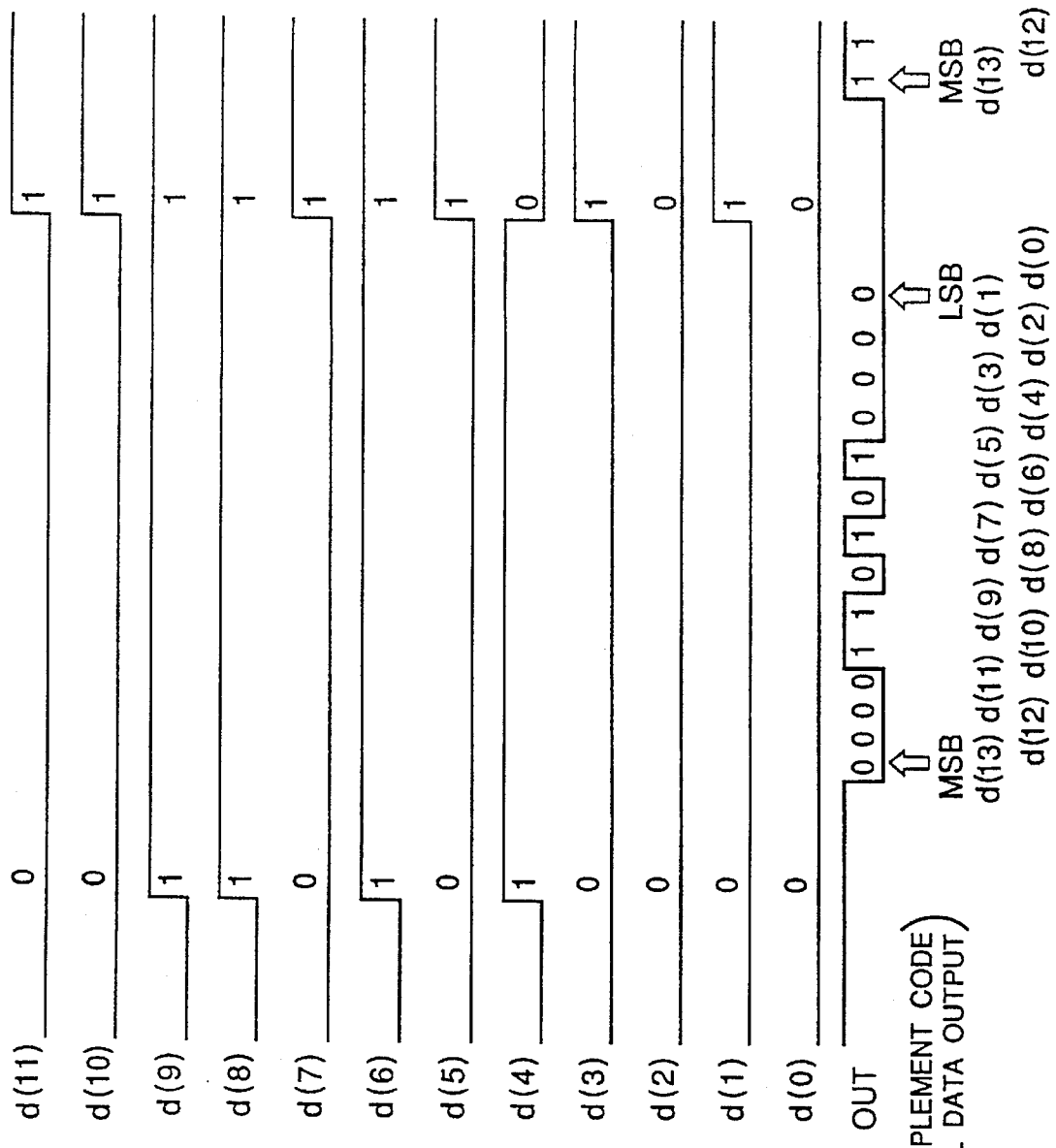
Figure 15A:
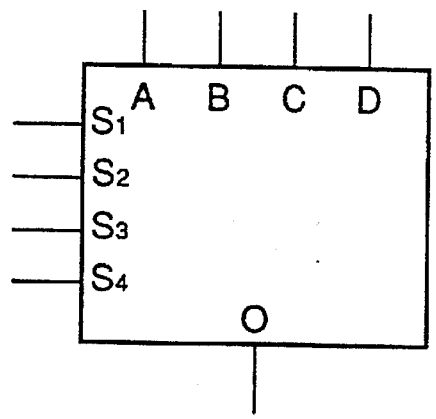
FIGS. 15A to 15F show circuit diagrams of function units included in the conventional parallel-to-serial conversion circuit shown in FIG. 1.
Figure 15B:
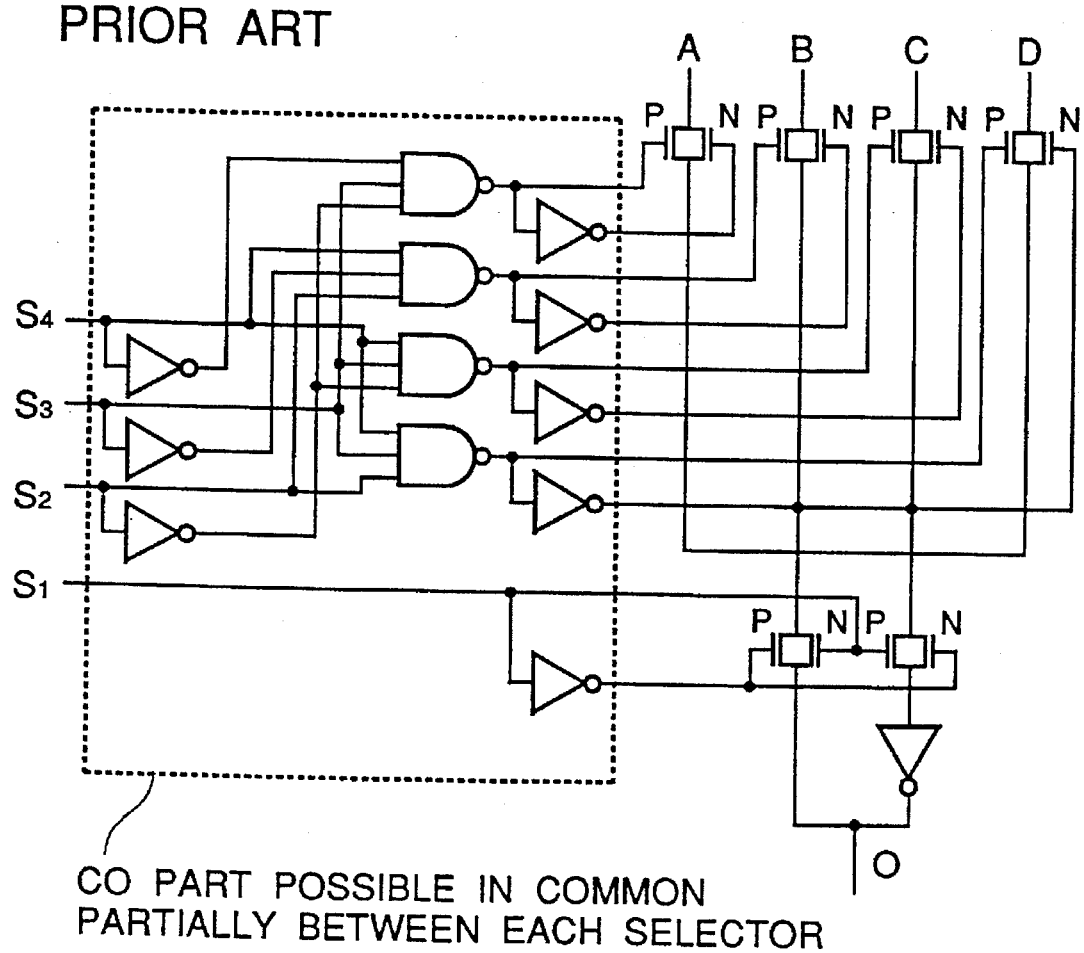
Figure 15C:
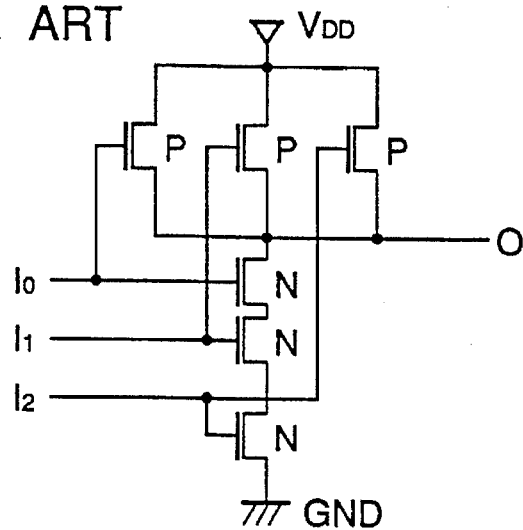
Figure 15D:

Returning to FIGS. 15A to 15F, symbols and internal circuit diagrams of various function units which can be used in the embodiments of this invention and the prior art example, are shown. A selector circuit indicated by the symbol shown in FIG. 15A, composed of 9 inverters, 4 NAND gates, 6 pairs of switch gates as shown in FIG. 15B. The shown selector circuit can be constituted of 56 transistors. A 3-input NAND gate shown in FIG. 15D is composed of 3 P-channel transistors and 3 N-channel transistors as shown in FIG. 15C. An inverter shown in FIG. 15F is composed of one P-channel transistor and one N-channel transistor as shown in FIG. 15E.

Figure 15E:
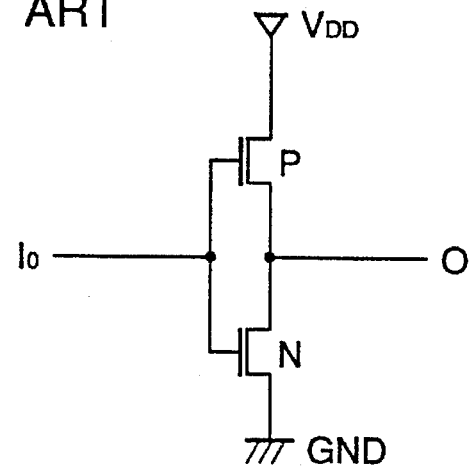
Figure 15F:
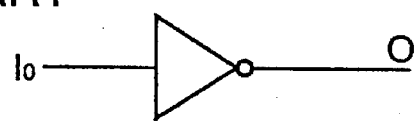

If the parallel-to-serial conversion circuit in accordance with the present invention is constituted of MOS transistors so that internal circuits of various function units are formed as showing in FIGS. 15B, 15C and 15E, since a part C0 of the selector shown in FIG. 15B can be used in common (for example to the selectors SE11 to SE16), the conversion circuit in accordance with the present invention can be constituted of 218 transistors, which is less than a half of about 470 transistors required to constitute the conventional conversion circuit.

As mentioned above, the present invention makes it possible to replace 8-input/14-output decoder having a large circuit scale by a small scale control circuit and selectors, and also to replace the 14-bit shift registers by 6-bit shift registers. Therefore, a parallel-to-serial data conversion circuit may be realized by a small scale of circuit.

The invention has thus been shown and described with reference to the specific embodiments. However, it should be noted that the present invention is in no way limited to the details of the illustrated structures but changes and modifications may be made within the scope of the appended claims.

I claim:

1. A parallel-to-serial data conversion circuit including:

a control circuit for receiving a load signal, a clock signal and high-order bits of parallel data of an 8-bit Pulse Code Modulation "PCM" code, said high-order bits not including a Most Significant Bit "MSB" bit, for generating a first control signal and a second control signal, a 6-bit shift register for receiving the first control signal, the second control signal, low-order 4 bits of the parallel data, a store signal and the clock signal, and a selector for selecting the output of the shift register on the basis of the MSB bit and the first control signal.

2. A parallel-to-serial data conversion circuit for converting parallel input data of an 8-bit Pulse Code Modulation "PCM" PCM code comprising bits I(7), I(6), I(5), I(4), I(3), I(2), I(1) and I(0) in the order of a Most Significant Bit "MSB" bit to a Least Significant Bit "LSB" bit, to a 14-bit serial data of 2'complement code, in accordance with an "A-law regulation", said conversion circuit including:

a control circuit for receiving said bits I(6), I(5) and I(4), a clock signal, a store signal for fetching an input data, a load signal for outputting a converted data, said control circuit generating a first control signal for giving a first controlled logical level and also for a switching control, a second control signal for giving a second controlled logical level, and a shift clock;

a 6-bit shift register for receiving said bits I(3), I(2), I(1) and I(0), said first control signal and said second control signal, and controlled by said first control signal and said shift clock so as to selectively shift out said bits I(3), I(2), I(1) and I(0), said first control signal and said second control signal; and a selector for receiving an output of said shift register and controlled by said bit I(7) and said first control signal so as to selectively output said output of said shift register.

3. A circuit as in claim 1, wherein said control circuit comprises:

a plurality of AND circuits for receiving said high-order bits and said store signal;

a plurality of counter circuits, each respectively connected to AND circuits of said AND circuits associated with said high-order bits;

a first AND circuit connected to said counter circuits; and a latch circuit for receiving said store signal and being connected to said first AND circuit, said latch circuit for outputting said first control signal.

4. A circuit as in claim 1, wherein said shift register comprises:

a plurality of first selector circuits for receiving said low-order 4 bits and said first control signal;

a second selector circuit for receiving said first control signal and said second control signal;

an inverter for receiving said first control signal and outputting an inverted first control signal;

a third selector circuit for receiving said inverted first control signal and said store signal; and a plurality of latch circuits for receiving said clock signal and being connected to adjacent selector circuits of said first selector circuits.

5. A circuit as in claim 1, wherein said selector comprises:

a first selector circuit for receiving an output of said shift register and said first control signal;

an inverter for receiving an output of said first selector circuit; and a second selector circuit for receiving outputs of said first selector circuit, said inverter and said MSB bit and for outputting a serial output.

6. A circuit as in claim 2, wherein said control circuit comprises:

a plurality of AND circuits for receiving said bits I(6), I(5) and I(4) and said store signal;

a plurality of counter circuits, each respectively connected to AND circuits of said AND circuits associated with said bits I(6), I(5) and I(4);

a first AND circuit connected to said counter circuits; and a latch circuit for receiving said store signal and being connected to said first AND circuit, said latch circuit for outputting said first control signal.

7. A circuit as in claim 2, wherein said shift register comprises:

a plurality of first selector circuits for receiving said bits I(3), I(2), I(1) and I(0) and said first control signal;

a second selector circuit for receiving said first control signal and said second control signal;

an inverter for receiving said first control signal and outputting an inverted first control signal;

a third selector circuit for receiving said inverted first control signal and said store signal; and a plurality of latch circuits for receiving said clock signal and being connected to adjacent selector circuits of said first selector circuits.

8. A circuit as in claim 2, wherein said selector comprises:

a first selector circuit for receiving an output of said shift register and said first control signal;

an inverter for receiving an output of said first selector circuit; and a second selector circuit for receiving outputs of said first selector circuit, said inverter and said I(7) bit input and for outputting a serial output.

9. A parallel-to-serial conversion circuit for receiving a plurality of parallel inputs including a most significant bit input, high-order inputs and low-order inputs, said circuit comprising:

a register for receiving said low-order inputs; and means for controlling said register based on said most significant bit input and said high-order inputs and for outputting a serial output.

10. A circuit as in claim 9, wherein said means for controlling includes:

a control circuit for receiving said high-order inputs; and a selector connected to said control circuit for outputting said serial output.

11. A circuit as in claim 9, wherein said circuit is for receiving an 8-bit parallel input;

said register comprising a 6-bit register; and said controlling means being for outputting a 14-bit serial data output.

12. A circuit as in claim 9, wherein said means for controlling is for receiving a store signal, a load signal and a clock signal, said register for receiving said clock signal, said controlling means being for outputting at least one control signal to said register and said selector, based on said high-order inputs, said load signal and said clock signal, for controlling said register and said selector.

13. A circuit as in claim 12, wherein said means for controlling includes a control circuit for receiving said high-order inputs and a selector connected to said control circuit, said circuit for receiving an 8-bit parallel input, said register comprising a 6-bit register, and said selector for outputting a 14-bit serial data output.

14. A circuit as in claim 13, wherein:

said most significant bit input comprises an I(7) bit input;

said high-order inputs comprise an I(6) bit input, an I(5) bit input and an I(4) bit input; and said low-order inputs comprise an I(3) bit input, an I(2) bit input, an I(1) bit input and an I(0) bit input.

15. A circuit as in claim 14, wherein said control circuit comprises:

a plurality of AND circuits for receiving said high-order inputs and said store signal;

a plurality of counter circuits, each respectively connected to AND circuits associated with said high-order inputs;

an additional AND circuit connected to said counter circuits; and a latch circuit for receiving said store signal and being connected to said first AND circuit, said latch circuit outputting a control signal of said at least one control signal.

16. A circuit as in claim 15, wherein said plurality of AND circuits comprises:

a NAND circuit for receiving said I(6) bit input and said I(5) bit input;

a first AND circuit for receiving said I(4) bit input and an output of said NAND circuit;

a second AND circuit for receiving said store signal and an output of said first AND circuit;

a third AND circuit for receiving said I(6) bit input and said store signal; and a fourth AND circuit for receiving said I(5) bit input and said store signal.

17. A circuit as in claim 16, wherein said plurality of counter circuits each comprise:

a first counter circuit for receiving said clock signal and outputs of said second AND circuit and said first AND circuit;

a second counter circuit for receiving said clock signal and outputs of said third AND circuit and said first AND circuit; and a third counter circuit for receiving said clock signal and outputs of said fourth AND circuit and said first AND circuit.

18. A circuit as in claim 17, further comprising:

an inverter for receiving said I(4) bit input; and a NOR circuit for receiving said output of said NAND circuit and an output of said inverter, said NOR circuit for outputting a second control signal of said control signals.

19. A circuit as in claim 14, wherein said at least one control signal include a first control signal and a second control signal, and said register comprises:

a plurality of first selector circuits for receiving said low-order bit inputs and said first control signal;

a second selector circuit for receiving said first control signal and said second control signal;

an inverter for receiving said first control signal and for outputting an inverted first control signal;

a third selector circuit for receiving said inverted first control signal and said store signal; and a plurality of latch circuits for receiving said clock signal, and being connected to adjacent selector circuits of said first selector circuits.

20. A circuit as in claim 14, wherein said selector comprises:

a first selector circuit for receiving an output of said register and a first control signal of said control signals;

an inverter for receiving an output of said first selector circuit; and a second selector circuit for receiving an output of said first selector circuit, said inverter and said I(7) bit input, and for outputting said serial output.

* * * * *